US012598925B2

(12) United States Patent
Schloss et al.

(10) Patent No.: US 12,598,925 B2
(45) Date of Patent: Apr. 7, 2026

(54) NON-METAL INCORPORATION IN MOLYBDENUM ON DIELECTRIC SURFACES

(71) Applicant: Lam Research Corporation, Fremont, CA (US)

(72) Inventors: Lawrence Schloss, Palo Alto, CA (US); Joshua Collins, Sebastopol, CA (US); Griffin John Kennedy, Livermore, CA (US); Hanna Bamnolker, Cupertino, CA (US); Sang-Hyeob Lee, Fremont, CA (US); Patrick van Cleemput, Duvall, WA (US); Sanjay Gopinath, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 416 days.

(21) Appl. No.: 18/547,481

(22) PCT Filed: Feb. 18, 2022

(86) PCT No.: PCT/US2022/017005
§ 371 (c)(1),
(2) Date: Aug. 22, 2023

(87) PCT Pub. No.: WO2022/182590
PCT Pub. Date: Sep. 1, 2022

(65) Prior Publication Data
US 2024/0136192 A1 Apr. 25, 2024
US 2024/0234152 A9 Jul. 11, 2024

Related U.S. Application Data

(60) Provisional application No. 63/200,237, filed on Feb. 23, 2021.

(51) Int. Cl.
*H01L 21/285* (2006.01)
*C23C 16/02* (2006.01)
(Continued)

(52) U.S. Cl.
CPC ........ *H01L 21/28568* (2013.01); *C23C 16/02* (2013.01); *C23C 16/14* (2013.01);
(Continued)

(58) Field of Classification Search
CPC .............. C23C 16/02; C23C 16/45527; C23C 16/45544; C23C 16/46; C23C 16/52;
(Continued)

(56) References Cited

U.S. PATENT DOCUMENTS 1,012,671 A 12/1911 Long
5,028,565 A 7/1991 Chang et al.
(Continued)

FOREIGN PATENT DOCUMENTS

CN 1332267 A 1/2002
CN 1675402 A 9/2005
(Continued)

OTHER PUBLICATIONS

Anonymous, "Lam Research enables next-generation memory with industry's first ALD process for low-fluorine tungsten fill" Semiconductor Digest News and Industry Trends for Solid State Technology, Aug. 2016, 2 Pages.
(Continued)

*Primary Examiner* — Mohsen Ahmadi
(74) *Attorney, Agent, or Firm* — Weaver Austin Villeneuve & Sampson LLP

(57) ABSTRACT

Provided herein are low resistance metallization stack structures for 3D-NAND applications and related methods of fabrication. In some embodiments, thin metal oxynitride nucleation layers are deposited on dielectric material fol-
(Continued)

lowed by deposition of a pure metal conductor using process conditions that increase non-molybdenum component element content at the oxynitride-dielectric interface. Certain embodiments of the methods described below convert less than all of the metal oxynitride nucleation layer to a pure metal layer, further lowering the resistivity.

8 Claims, 12 Drawing Sheets

(51) Int. Cl.

| | |
|---|---|
| C23C 16/06 | (2006.01) |
| C23C 16/14 | (2006.01) |
| C23C 16/455 | (2006.01) |
| C23C 16/46 | (2006.01) |
| C23C 16/52 | (2006.01) |
| C23C 16/56 | (2006.01) |
| H01L 21/3205 | (2006.01) |
| H01L 21/768 | (2006.01) |

(52) U.S. Cl.
CPC .. *C23C 16/45527* (2013.01); *C23C 16/45544* (2013.01); *C23C 16/46* (2013.01); *C23C 16/52* (2013.01)

(58) Field of Classification Search
CPC ..... C23C 16/0272; C23C 16/56; C23C 16/06; H01L 21/76876; H01L 21/28562; H01L 21/32051
See application file for complete search history.

(56) References Cited

U.S. PATENT DOCUMENTS

| | | | |
|---|---|---|---|
| 5,502,005 A | 3/1996 | Mikagi |
| 5,612,254 A | 3/1997 | Mu et al. |
| 5,643,394 A | 7/1997 | Maydan et al. |
| 5,661,080 A | 8/1997 | Hwang et al. |
| 5,795,824 A | 8/1998 | Hancock |
| 5,804,249 A | 9/1998 | Sukharev et al. |
| 5,863,836 A | 1/1999 | Jones |
| 5,956,609 A | 9/1999 | Lee et al. |
| 6,066,366 A | 5/2000 | Berenbaum et al. |
| 6,103,609 A | 8/2000 | Lee et al. |
| 6,107,200 A | 8/2000 | Takagi et al. |
| 6,143,082 A | 11/2000 | McINERNEY et al. |
| 6,271,084 B1 | 8/2001 | Tu et al. |
| 6,284,653 B1 | 9/2001 | Tseng |
| 6,306,216 B1 | 10/2001 | Kim et al. |
| 6,359,160 B1 | 3/2002 | Sun et al. |
| 6,635,965 B1 | 10/2003 | Lee et al. |
| 6,794,287 B2 | 9/2004 | Saanila et al. |
| 6,844,258 B1 | 1/2005 | Fair et al. |
| 6,905,543 B1 | 6/2005 | Fair et al. |
| 6,958,174 B1 | 10/2005 | Klaus et al. |
| 6,979,625 B1 | 12/2005 | Woo et al. |
| 7,005,372 B2 | 2/2006 | Levy et al. |
| 7,141,494 B2 | 11/2006 | Lee et al. |
| 7,250,367 B2 | 7/2007 | Vaartstra et al. |
| 7,262,125 B2 | 8/2007 | Wongsenakhum et al. |
| 7,560,581 B2 | 7/2009 | Gordon et al. |
| 7,589,017 B2 | 9/2009 | Chan et al. |
| 7,691,749 B2 | 4/2010 | Levy et al. |
| 7,772,114 B2 | 8/2010 | Chan et al. |
| 7,955,972 B2 | 6/2011 | Chan et al. |
| 7,993,457 B1 | 8/2011 | Krotov et al. |
| 8,053,365 B2 | 11/2011 | Humayun et al. |
| 8,058,170 B2 | 11/2011 | Chandrashekar et al. |
| 8,089,128 B2 | 1/2012 | Ramaswamy et al. |
| 8,101,521 B1 | 1/2012 | Gao et al. |
| 8,119,527 B1 | 2/2012 | Chadrashekar et al. |
| 8,278,216 B1 | 10/2012 | Alers et al. |

| | | | |
|---|---|---|---|
| 9,076,646 B2 | 7/2015 | Sims et al. |
| 9,082,826 B2 | 7/2015 | Chandrashekar et al. |
| 9,159,571 B2 | 10/2015 | Humayun et al. |
| 9,175,023 B2 | 11/2015 | Odedra et al. |
| 9,236,297 B2 | 1/2016 | Chen et al. |
| 9,548,266 B2 | 1/2017 | Ajuria et al. |
| 9,583,385 B2 | 2/2017 | Lee et al. |
| 9,595,470 B2 | 3/2017 | Bamnolker et al. |
| 9,613,818 B2 | 4/2017 | Ba et al. |
| 9,653,353 B2 | 5/2017 | Chandrashekar et al. |
| 9,659,998 B1 | 5/2017 | Lung |
| 9,899,372 B1 | 2/2018 | Bi et al. |
| 9,978,605 B2 | 5/2018 | Bamnolker et al. |
| 10,014,185 B1 | 7/2018 | Wu et al. |
| 10,079,144 B2 | 9/2018 | Kim et al. |
| 10,094,021 B2 | 10/2018 | Lansalot-Matras et al. |
| 10,096,475 B1 | 10/2018 | Shaikh |
| 10,121,671 B2 | 11/2018 | Fu et al. |
| 10,283,404 B2 | 5/2019 | Na et al. |
| 10,395,984 B2 | 8/2019 | Backes et al. |
| 10,505,111 B1 | 12/2019 | Ok et al. |
| 10,510,590 B2 | 12/2019 | Thombare et al. |
| 10,510,951 B1 | 12/2019 | Yu et al. |
| 10,566,211 B2 | 2/2020 | Chandrashekar et al. |
| 10,573,522 B2 | 2/2020 | Jandl et al. |
| 10,622,375 B2 | 4/2020 | Chun et al. |
| 10,643,826 B2 | 5/2020 | Kim et al. |
| 10,643,904 B2 | 5/2020 | Xie et al. |
| 10,731,250 B2 | 8/2020 | Kim et al. |
| 10,734,238 B2 | 8/2020 | Zhou et al. |
| 10,777,453 B2 | 9/2020 | Thombare et al. |
| 10,995,405 B2 | 5/2021 | Dezelah et al. |
| 11,211,253 B2 | 12/2021 | Zhou et al. |
| 11,295,980 B2 | 4/2022 | Zope et al. |
| 11,355,345 B2 | 6/2022 | Jandl et al. |
| 11,549,175 B2 | 1/2023 | Butail et al. |
| 11,821,071 B2 | 11/2023 | Blakeney |
| 11,970,776 B2 | 4/2024 | Collins et al. |
| 12,014,928 B2 | 6/2024 | Ba et al. |
| 12,074,029 B2 | 8/2024 | Van Cleemput et al. |
| 12,148,623 B2 | 11/2024 | Van Cleemput et al. |
| 12,327,762 B2 | 6/2025 | Schloss et al. |
| 12,334,351 B2 | 6/2025 | Na et al. |
| 12,351,914 B2 | 7/2025 | Collins et al. |
| 12,362,188 B2 | 7/2025 | Jandl et al. |
| 2001/0002326 A1 | 5/2001 | Yang et al. |
| 2002/0009872 A1 | 1/2002 | Hoshino et al. |
| 2002/0024140 A1 | 2/2002 | Nakajima et al. |
| 2002/0045355 A1 | 4/2002 | Chong et al. |
| 2002/0090796 A1 | 7/2002 | Desai et al. |
| 2003/0019428 A1 | 1/2003 | Ku et al. |
| 2003/0059980 A1 | 3/2003 | Chen et al. |
| 2003/0082296 A1 | 5/2003 | Elers et al. |
| 2003/0104126 A1 | 6/2003 | Fang et al. |
| 2003/0127043 A1 | 7/2003 | Lu et al. |
| 2003/0194825 A1 | 10/2003 | Law et al. |
| 2003/0209193 A1 | 11/2003 | Van Wijck |
| 2004/0087143 A1 | 5/2004 | Norman et al. |
| 2004/0202786 A1 | 10/2004 | Wongsenakhum et al. |
| 2005/0031786 A1 | 2/2005 | Lee et al. |
| 2005/0186342 A1 | 8/2005 | Sager et al. |
| 2005/0212139 A1 | 9/2005 | Leinikka et al. |
| 2005/0277296 A1 | 12/2005 | Adetutu et al. |
| 2005/0282384 A1 | 12/2005 | Nawafune et al. |
| 2006/0040052 A1 | 2/2006 | Fang et al. |
| 2006/0046521 A1 | 3/2006 | Vaartstra et al. |
| 2006/0102950 A1 | 5/2006 | Takebuchi et al. |
| 2006/0115590 A1 | 6/2006 | Suzuki et al. |
| 2007/0009658 A1 | 1/2007 | Yoo et al. |
| 2007/0066060 A1 | 3/2007 | Wang |
| 2007/0077712 A1 | 4/2007 | Joo et al. |
| 2007/0190780 A1 | 8/2007 | Chung et al. |
| 2007/0215852 A1 | 9/2007 | Lung |
| 2007/0232015 A1 | 10/2007 | Liu |
| 2008/0014352 A1 | 1/2008 | Xi et al. |
| 2008/0061282 A1 | 3/2008 | Sato et al. |
| 2008/0116437 A1 | 5/2008 | Oh et al. |
| 2008/0124926 A1 | 5/2008 | Chan et al. |
| 2008/0170984 A1 | 7/2008 | Tenne et al. |

(56)     References Cited

U.S. PATENT DOCUMENTS

| | | |
|---|---|---|
| 2008/0197335 A1 | 8/2008 | Yu |
| 2008/0206987 A1 | 8/2008 | Gelatos et al. |
| 2008/0227291 A1 | 9/2008 | Lai et al. |
| 2008/0254623 A1 | 10/2008 | Chan et al. |
| 2008/0268642 A1 | 10/2008 | Yanagita et al. |
| 2008/0274617 A1 | 11/2008 | Milligan |
| 2008/0280390 A1 | 11/2008 | Kim et al. |
| 2008/0303014 A1 | 12/2008 | Goux et al. |
| 2008/0317972 A1 | 12/2008 | Hendriks et al. |
| 2009/0004848 A1 | 1/2009 | Kim et al. |
| 2009/0053893 A1 | 2/2009 | Khandelwal et al. |
| 2009/0081374 A1 | 3/2009 | Yang et al. |
| 2009/0149022 A1 | 6/2009 | Chan et al. |
| 2009/0212280 A1 | 8/2009 | Werner et al. |
| 2009/0239368 A1 | 9/2009 | Park et al. |
| 2009/0304914 A1 | 12/2009 | Nalla et al. |
| 2010/0107927 A1 | 5/2010 | Stewart et al. |
| 2010/0159694 A1 | 6/2010 | Chandrashekar et al. |
| 2010/0167527 A1 | 7/2010 | Wu et al. |
| 2010/0168404 A1 | 7/2010 | Girolami et al. |
| 2010/0176512 A1 | 7/2010 | Yang et al. |
| 2010/0207245 A1 | 8/2010 | Cheng et al. |
| 2010/0213541 A1 | 8/2010 | Jeon et al. |
| 2010/0227473 A1 | 9/2010 | Matsuda et al. |
| 2010/0320607 A1 | 12/2010 | Suzuki |
| 2011/0020546 A1 | 1/2011 | Hamalainen et al. |
| 2011/0021024 A1 | 1/2011 | Calvo-Munoz et al. |
| 2011/0146568 A1 | 6/2011 | Haukka et al. |
| 2011/0151615 A1 | 6/2011 | Gordon et al. |
| 2011/0155993 A1 | 6/2011 | Chen |
| 2011/0223763 A1 | 9/2011 | Chan et al. |
| 2011/0256645 A1 | 10/2011 | Tam et al. |
| 2011/0256726 A1 | 10/2011 | Lavoie et al. |
| 2011/0287184 A1 | 11/2011 | Shenai-Khatkhate et al. |
| 2012/0045589 A1 | 2/2012 | Ivanov et al. |
| 2012/0119177 A1 | 5/2012 | Erbetta |
| 2012/0187305 A1 | 7/2012 | Elam et al. |
| 2012/0231626 A1 | 9/2012 | Lee et al. |
| 2012/0305872 A1 | 12/2012 | Yoon |
| 2013/0109172 A1 | 5/2013 | Collins et al. |
| 2013/0164928 A1 | 6/2013 | Lim et al. |
| 2013/0189837 A1 | 7/2013 | Haukka et al. |
| 2013/0270703 A1 | 10/2013 | Zierath et al. |
| 2013/0302980 A1 | 11/2013 | Chandrashekar et al. |
| 2014/0106083 A1 | 4/2014 | Wu et al. |
| 2014/0138604 A1 | 5/2014 | Liu et al. |
| 2014/0147589 A1 | 5/2014 | Khandelwal et al. |
| 2014/0217590 A1 | 8/2014 | Nalla et al. |
| 2014/0284801 A1 | 9/2014 | Kitamura et al. |
| 2014/0349477 A1 | 11/2014 | Chandrashekar et al. |
| 2014/0370192 A1 | 12/2014 | Odedra et al. |
| 2015/0024592 A1 | 1/2015 | Chandrashekar et al. |
| 2015/0170961 A1 | 6/2015 | Romero et al. |
| 2015/0179461 A1 | 6/2015 | Bamnolker et al. |
| 2015/0262939 A1 | 9/2015 | Sakata |
| 2015/0325475 A1 | 11/2015 | Bamnolker et al. |
| 2015/0348840 A1 | 12/2015 | Bamnolker et al. |
| 2015/0354064 A1 | 12/2015 | Kolics et al. |
| 2016/0027614 A1 | 1/2016 | Manna et al. |
| 2016/0040289 A1 | 2/2016 | Gatineau et al. |
| 2016/0056074 A1 | 2/2016 | Na et al. |
| 2016/0064409 A1 | 3/2016 | Yaegashi |
| 2016/0077435 A1 | 3/2016 | Ban et al. |
| 2016/0104624 A1 | 4/2016 | Fu et al. |
| 2016/0109800 A1 | 4/2016 | Bae et al. |
| 2016/0118345 A1 | 4/2016 | Chen et al. |
| 2016/0141419 A1 | 5/2016 | Baenninger et al. |
| 2016/0168699 A1 | 6/2016 | Fukazawa et al. |
| 2016/0172211 A1 | 6/2016 | Demos et al. |
| 2016/0181149 A1 | 6/2016 | Deng |
| 2016/0181272 A1 | 6/2016 | Rabkin et al. |
| 2016/0225632 A1 | 8/2016 | Shaikh et al. |
| 2016/0233220 A1 | 8/2016 | Danek et al. |
| 2016/0300952 A1 | 10/2016 | Toriumi et al. |
| 2016/0309596 A1 | 10/2016 | Shaviv et al. |
| 2016/0343612 A1 | 11/2016 | Wang et al. |
| 2016/0351401 A1 | 12/2016 | Ba et al. |
| 2016/0351444 A1 | 12/2016 | Schloss et al. |
| 2017/0016113 A1 | 1/2017 | Thompson et al. |
| 2017/0040214 A1 | 2/2017 | Lai et al. |
| 2017/0062224 A1 | 3/2017 | Fu et al. |
| 2017/0062714 A1 | 3/2017 | Kau |
| 2017/0069527 A1 | 3/2017 | Haukka et al. |
| 2017/0117155 A1 | 4/2017 | Bamnolker et al. |
| 2017/0125548 A1 | 5/2017 | Hung et al. |
| 2017/0170026 A1 | 6/2017 | Hudson et al. |
| 2017/0178899 A1 | 6/2017 | Kabansky et al. |
| 2017/0213901 A1 | 7/2017 | Ho et al. |
| 2017/0229341 A1 | 8/2017 | Chang et al. |
| 2017/0268107 A1 | 9/2017 | Lansalot-Matras et al. |
| 2017/0294381 A1 | 10/2017 | Briggs et al. |
| 2017/0306479 A1 | 10/2017 | Raisanen et al. |
| 2017/0306490 A1 | 10/2017 | Chan et al. |
| 2017/0350008 A1 | 12/2017 | Collins et al. |
| 2017/0358482 A1 | 12/2017 | Chen et al. |
| 2018/0019165 A1* | 1/2018 | Baum .................... C23C 16/14 |
| 2018/0053660 A1 | 2/2018 | Jandl et al. |
| 2018/0142345 A1 | 5/2018 | Meng et al. |
| 2018/0151497 A1 | 5/2018 | Makala et al. |
| 2018/0166276 A1 | 6/2018 | Nakao et al. |
| 2018/0218902 A1 | 8/2018 | Venkatasubramania et al. |
| 2018/0240675 A1 | 8/2018 | Bamnolker et al. |
| 2018/0240676 A1 | 8/2018 | Chan et al. |
| 2018/0247832 A1 | 8/2018 | Fischer et al. |
| 2018/0261503 A1 | 9/2018 | Meng et al. |
| 2018/0286668 A1 | 10/2018 | Baum et al. |
| 2018/0294187 A1 | 10/2018 | Thombare et al. |
| 2018/0312966 A1* | 11/2018 | Chan ................. H01L 21/28562 |
| 2018/0342390 A1 | 11/2018 | Xiao et al. |
| 2018/0347041 A1 | 12/2018 | Kim et al. |
| 2018/0355484 A1 | 12/2018 | Lansalot-Matras et al. |
| 2019/0003050 A1 | 1/2019 | Dezelah et al. |
| 2019/0006226 A1 | 1/2019 | Khare et al. |
| 2019/0019725 A1 | 1/2019 | Chandrashekar et al. |
| 2019/0067003 A1 | 2/2019 | Zope et al. |
| 2019/0067014 A1 | 2/2019 | Shrestha et al. |
| 2019/0067094 A1* | 2/2019 | Zope ................. H01L 23/53266 |
| 2019/0067095 A1 | 2/2019 | Zhu et al. |
| 2019/0088474 A1 | 3/2019 | Macdonald et al. |
| 2019/0088555 A1 | 3/2019 | Xie et al. |
| 2019/0157102 A1 | 5/2019 | Jian et al. |
| 2019/0157141 A1 | 5/2019 | Liao et al. |
| 2019/0161853 A1 | 5/2019 | Aoyama et al. |
| 2019/0177838 A1 | 6/2019 | Cadot et al. |
| 2019/0189456 A1 | 6/2019 | Mullick et al. |
| 2019/0189688 A1 | 6/2019 | Lille |
| 2019/0226086 A1 | 7/2019 | Wright, Jr. et al. |
| 2019/0256467 A1 | 8/2019 | Anthis et al. |
| 2019/0273019 A1 | 9/2019 | Mullick et al. |
| 2019/0282384 A1 | 9/2019 | Phillips |
| 2019/0368039 A1 | 12/2019 | Arteaga et al. |
| 2019/0371662 A1 | 12/2019 | Chen et al. |
| 2020/0006073 A1 | 1/2020 | Smith et al. |
| 2020/0010954 A1 | 1/2020 | Bhuyan et al. |
| 2020/0075403 A1 | 3/2020 | Thombare et al. |
| 2020/0105515 A1 | 4/2020 | Maes et al. |
| 2020/0111675 A1 | 4/2020 | Takatsuki et al. |
| 2020/0115798 A1 | 4/2020 | Wright, Jr. et al. |
| 2020/0131628 A1 | 4/2020 | Baum et al. |
| 2020/0144066 A1 | 5/2020 | Jandl et al. |
| 2020/0152870 A1 | 5/2020 | Lin et al. |
| 2020/0194670 A1 | 6/2020 | Allegra |
| 2020/0199743 A1 | 6/2020 | Wright, Jr. et al. |
| 2020/0219933 A1 | 7/2020 | Cheng |
| 2020/0227275 A1 | 7/2020 | Mullick et al. |
| 2020/0242209 A1 | 7/2020 | Bowes et al. |
| 2020/0332416 A1 | 10/2020 | Fluit |
| 2020/0343136 A1 | 10/2020 | Yu et al. |
| 2020/0365456 A1 | 11/2020 | Thombare et al. |
| 2020/0402846 A1 | 12/2020 | Collins et al. |
| 2021/0014048 A1 | 1/2021 | Lee et al. |
| 2021/0047726 A1 | 2/2021 | Liu et al. |
| 2021/0057223 A1 | 2/2021 | Stevens et al. |
| 2021/0082750 A1 | 3/2021 | Yu et al. |

(56)  References Cited

U.S. PATENT DOCUMENTS

| | | |
|---|---|---|
| 2021/0098532 A1 | 4/2021 | Wu |
| 2021/0123136 A1 | 4/2021 | Kalutarage et al. |
| 2021/0140043 A1 | 5/2021 | Thombare et al. |
| 2021/0140048 A1 | 5/2021 | Moon et al. |
| 2021/0151352 A1 | 5/2021 | Zope et al. |
| 2021/0238736 A1 | 8/2021 | Butail et al. |
| 2021/0277517 A1 | 9/2021 | Liu et al. |
| 2021/0285102 A1 | 9/2021 | Yoon et al. |
| 2021/0313183 A1 | 10/2021 | Ba et al. |
| 2021/0320034 A1 | 10/2021 | Lei et al. |
| 2021/0348271 A1 | 11/2021 | Mishra et al. |
| 2021/0407809 A1 | 12/2021 | Zope et al. |
| 2022/0013365 A1 | 1/2022 | Van Cleemput et al. |
| 2022/0018017 A1 | 1/2022 | Kim et al. |
| 2022/0037163 A1 | 2/2022 | Yang et al. |
| 2022/0044929 A1 | 2/2022 | Xiao et al. |
| 2022/0139713 A1 | 5/2022 | Färm et al. |
| 2022/0170155 A1 | 6/2022 | Blakeney |
| 2022/0195598 A1 | 6/2022 | Collins et al. |
| 2022/0220136 A1 | 7/2022 | Leoncini et al. |
| 2022/0220139 A1 | 7/2022 | Leoncini et al. |
| 2022/0220607 A1 | 7/2022 | Leoncini et al. |
| 2022/0223471 A1 | 7/2022 | Thombare et al. |
| 2022/0262640 A1 | 8/2022 | Jandl et al. |
| 2022/0285211 A1 | 9/2022 | Färm et al. |
| 2022/0298624 A1 | 9/2022 | Blakeney et al. |
| 2022/0325410 A1 | 10/2022 | Yoon et al. |
| 2022/0328317 A1 | 10/2022 | Na et al. |
| 2022/0356579 A1 | 11/2022 | Collins et al. |
| 2022/0359211 A1 | 11/2022 | Van Cleemput et al. |
| 2022/0375792 A1 | 11/2022 | Schloss et al. |
| 2022/0389579 A1 | 12/2022 | Thombare et al. |
| 2023/0290680 A1 | 9/2023 | Collins et al. |
| 2023/0298896 A1 | 9/2023 | Veber et al. |
| 2023/0326790 A1 | 10/2023 | Tarafdar et al. |
| 2024/0052486 A1 | 2/2024 | Blakeney |
| 2024/0136192 A1 | 4/2024 | Schloss et al. |
| 2024/0234152 A9 | 7/2024 | Schloss et al. |
| 2024/0271281 A1 | 8/2024 | Collins et al. |
| 2024/0282580 A1 | 8/2024 | Ba et al. |
| 2024/0297075 A1 | 9/2024 | Thombare et al. |
| 2024/0401196 A1 | 12/2024 | Thombare et al. |
| 2025/0029840 A1 | 1/2025 | Van Cleemput et al. |
| 2025/0038003 A1 | 1/2025 | Mandia et al. |
| 2025/0069948 A1 | 2/2025 | Mandia et al. |
| 2025/0132157 A1 | 4/2025 | Bhadauriya et al. |
| 2025/0179635 A1 | 6/2025 | Thombare et al. |
| 2025/0183097 A1 | 6/2025 | Lai et al. |
| 2025/0226227 A1 | 7/2025 | Austin et al. |
| 2025/0246434 A1 | 7/2025 | Lee et al. |
| 2025/0259894 A1 | 8/2025 | Griffiths et al. |
| 2025/0285920 A1 | 9/2025 | Schloss et al. |
| 2025/0287675 A1 | 9/2025 | Mahenderkar et al. |
| 2025/0323045 A1 | 10/2025 | Jandl et al. |
| 2025/0323046 A1 | 10/2025 | Na et al. |

FOREIGN PATENT DOCUMENTS

| | | | |
|---|---|---|---|
| CN | 1957446 A | 5/2007 |
| CN | 101308794 A | 11/2008 |
| CN | 101752299 A | 6/2010 |
| CN | 101207019 B | 12/2010 |
| CN | 102206387 A | 10/2011 |
| CN | 102206387 B | 4/2014 |
| CN | 104272441 A | 1/2015 |
| CN | 104752339 A | 7/2015 |
| CN | 105097446 A | 11/2015 |
| CN | 105280549 A | 1/2016 |
| CN | 106575626 A | 4/2017 |
| CN | 107305838 A | 10/2017 |
| CN | 107710443 A | 2/2018 |
| CN | 107768304 A | 3/2018 |
| CN | 108597983 A | 9/2018 |
| CN | 109072424 A | 12/2018 |
| CN | 109563621 A | 4/2019 |
| CN | 109661481 A | 4/2019 |
| EP | 1167567 A1 | 1/2002 |
| EP | 1728894 A1 | 12/2006 |
| EP | 1806352 A1 | 7/2007 |
| JP | S595246 A | 1/1984 |
| JP | H01181516 A | 7/1989 |
| JP | H02231714 A | 9/1990 |
| JP | H03131023 A | 6/1991 |
| JP | H10176273 A | 6/1998 |
| JP | H11238736 A | 8/1999 |
| JP | 2001172049 A | 6/2001 |
| JP | 2001257177 A | 9/2001 |
| JP | 2001274105 A | 10/2001 |
| JP | 2001284360 A | 10/2001 |
| JP | 3302108 B2 | 7/2002 |
| JP | 2002305162 A | 10/2002 |
| JP | 2003528215 A | 9/2003 |
| JP | 2005150416 A | 6/2005 |
| JP | 2006511716 A | 4/2006 |
| JP | 2007019375 A | 1/2007 |
| JP | 2007182443 A | 7/2007 |
| JP | 2008205219 A | 9/2008 |
| JP | 2008211183 A | 9/2008 |
| JP | 2011035366 A | 2/2011 |
| JP | 2012246531 A | 12/2012 |
| JP | 2014074190 A | 4/2014 |
| JP | 2014511380 A | 5/2014 |
| JP | 2014187208 A | 10/2014 |
| JP | 2015021175 A | 2/2015 |
| JP | 2015029097 A | 2/2015 |
| JP | 2016098406 A | 5/2016 |
| JP | 2016516892 A | 6/2016 |
| JP | 2016164131 A | 9/2016 |
| JP | 2017053024 A | 3/2017 |
| JP | 2017525156 A | 8/2017 |
| JP | 2018035375 A | 3/2018 |
| JP | 2019502253 A | 1/2019 |
| JP | 2019044266 A | 3/2019 |
| JP | 2019527302 A | 9/2019 |
| JP | 2019186508 A | 10/2019 |
| JP | 2019192906 A | 10/2019 |
| JP | 2020029618 A | 2/2020 |
| JP | 2020043139 A | 3/2020 |
| JP | 2020059916 A | 4/2020 |
| JP | 2020513065 A | 4/2020 |
| JP | 2020530663 A | 10/2020 |
| JP | 2021523983 A | 9/2021 |
| JP | 2021535575 A | 12/2021 |
| JP | 7485736 B2 | 5/2024 |
| KR | 0138381 B1 | 6/1998 |
| KR | 20030043201 A | 6/2003 |
| KR | 100477840 B1 | 6/2005 |
| KR | 20050054122 A | 6/2005 |
| KR | 20070073636 A | 7/2007 |
| KR | 20100068845 A | 6/2010 |
| KR | 20100096488 A | 9/2010 |
| KR | 20100114855 A | 10/2010 |
| KR | 20110014069 A | 2/2011 |
| KR | 20110024932 A | 3/2011 |
| KR | 20140034081 A | 3/2014 |
| KR | 20140138092 A | 12/2014 |
| KR | 20140143202 A | 12/2014 |
| KR | 20150005533 A | 1/2015 |
| KR | 20150063562 A | 6/2015 |
| KR | 20150077376 A | 7/2015 |
| KR | 20150108780 A | 9/2015 |
| KR | 20150128615 A | 11/2015 |
| KR | 20160072054 A | 6/2016 |
| KR | 20160098986 A | 8/2016 |
| KR | 20160135672 A | 11/2016 |
| KR | 20170042297 A | 4/2017 |
| KR | 101745074 B1 | 6/2017 |
| KR | 20170095801 A | 8/2017 |
| KR | 20170120498 A | 10/2017 |
| KR | 20180009702 A | 1/2018 |
| KR | 20180018372 A | 2/2018 |
| KR | 20180019487 A | 2/2018 |
| KR | 20180114159 A | 10/2018 |
| KR | 20180118055 A | 10/2018 |

(56)         References Cited

FOREIGN PATENT DOCUMENTS

| | | |
|---|---|---|
| KR | 20190009245 A | 1/2019 |
| KR | 20190024823 A | 3/2019 |
| KR | 20190024834 A | 3/2019 |
| KR | 20190024841 A | 3/2019 |
| KR | 20190028743 A | 3/2019 |
| KR | 20190086054 A | 7/2019 |
| KR | 20190130046 A | 11/2019 |
| KR | 20200026711 A | 3/2020 |
| KR | 20200056543 A | 5/2020 |
| KR | 20200078423 A | 7/2020 |
| KR | 20200090108 A | 7/2020 |
| KR | 20200140923 A | 12/2020 |
| KR | 20210156444 A | 12/2021 |
| TW | 201123305 A | 7/2011 |
| TW | 201542857 A | 11/2015 |
| TW | 201705490 A | 2/2017 |
| TW | 201710543 A | 3/2017 |
| TW | 201718942 A | 6/2017 |
| TW | 201738405 A | 11/2017 |
| TW | 201741325 A | 12/2017 |
| TW | 201812069 A | 4/2018 |
| TW | 201812070 A | 4/2018 |
| TW | 201903847 A | 1/2019 |
| TW | 201907037 A | 2/2019 |
| TW | 201911378 A | 3/2019 |
| TW | 201920736 A | 6/2019 |
| TW | 201920740 A | 6/2019 |
| TW | 202020203 A | 6/2020 |
| TW | 202030861 A | 8/2020 |
| TW | 202039911 A | 11/2020 |
| WO | WO-0127347 A1 | 4/2001 |
| WO | WO-2006036865 A2 | 4/2006 |
| WO | WO-2007005088 A2 | 1/2007 |
| WO | WO-2012047591 A1 | 4/2012 |
| WO | WO-2014052642 A1 | 4/2014 |
| WO | WO-2015023404 A1 | 2/2015 |
| WO | WO-2016191432 A1 | 12/2016 |
| WO | WO-2017070634 A1 | 4/2017 |
| WO | WO-2017091571 A1 | 6/2017 |
| WO | WO-2017143246 A1 | 8/2017 |
| WO | WO-2018191183 A1 | 10/2018 |
| WO | WO-2019036214 A1 | 2/2019 |
| WO | WO-2019099233 A1 | 5/2019 |
| WO | WO-2019118684 A1 | 6/2019 |
| WO | WO-2019232344 A1 | 12/2019 |
| WO | WO-2020023790 A1 | 1/2020 |
| WO | WO-2020028587 A1 | 2/2020 |
| WO | WO-2020106649 A1 | 5/2020 |
| WO | WO-2020159882 A1 | 8/2020 |
| WO | WO-2020185618 A1 | 9/2020 |
| WO | WO-2021028587 A1 | 2/2021 |
| WO | WO-2021035236 A1 | 2/2021 |
| WO | WO-2021046058 A1 | 3/2021 |
| WO | WO-2021076636 A1 | 4/2021 |
| WO | WO-2021178399 A1 | 9/2021 |
| WO | WO-2021237032 A1 | 11/2021 |
| WO | WO-2022108762 A1 | 5/2022 |
| WO | WO-2022150270 A1 | 7/2022 |
| WO | WO-2022221210 A1 | 10/2022 |
| WO | WO-2023114648 A1 | 6/2023 |

OTHER PUBLICATIONS

Barry, S.T., "Amidinates, Guanidinates and Iminopyrrolidinates: Understanding Precursor Thermolysis to Design a Better Ligand," Coordination Chemistry Reviews, Dec. 2013, vol. 257(23-24), pp. 3192-3201.

Barry, S.T., et al., "The Chemistry of Inorganic Precursors during the Chemical Deposition of Films on Solid Surfaces," Accounts of chemical research, 2018, vol. 51, pp. 800-809.

Becker, J., et al., "Diffusion Barrier Properties of Tungsten Nitride Films Grown by Atomic Layer Deposition From bis(tert-butylimido) bis(dimethylamido)tungsten and ammonia," Applied Physics Letters, 2003, vol. 82 (14), pp. 2239-2241.

Chinese First Office Action dated Jan. 4, 2021 issued in Application No. CN 201710700258.6.

Chinese Second Office Action dated Jun. 17, 2021 issued in Application No. CN 201710700258.6.

Chiu, H. et al., "Deposition of Molybdenum Carbonitride Thin Films from $Mo(NBu^t)_2(NHBu^t)_2$", J. Mater. Res, Jul. 1994, vol. 9, No. 7, pp. 1622-1624.

CN Office Action dated Dec. 28, 2023 in CN Application No. 202080059499.7 with English Translation.

CN Office Action dated Feb. 28, 2023 in Application No. 201880038116.0 with English translation.

CN Office Action dated Feb. 28, 2024 in CN Application No. 201980051278.2, with EnglishTranslation.

CN Office Action dated Jan. 13, 2023 in CN Application No. CN201980049916.7 with English Translation.

CN Office Action dated Jan. 16, 2023 in Application No. CN202080020646.X with English translation.

CN Office Action dated Jan. 18, 2024 in CN Application No. 202080020646.X with English translation.

CN Office Action dated Jul. 9, 2024 in CN Application No. 201980049916.7 with English translation.

CN Office Action dated Jun. 7, 2024 in CN Application No. 201880074995.2, with EnglishTranslation.

CN Office Action dated Jun. 27, 2024 in CN Application No. 201980076277.3 with English translation.

CN Office Action dated May 31, 2024 in CN Application No. 201980038600.8 with English translation.

CN Office Action dated Nov. 17, 2022, in Application No. CN202080011300.3 with English translation.

CN Office Action dated Sep. 24, 2023, in Application No. CN202080020646.X with English translation.

CN Office Action dated Sep. 28, 2023, in application No. CN201980049916.7 with English translation.

Colaianni, M.L., et al., "The Adsorption and Dissociation of Carbon Monoxide on Clean and Oxygen-Modified Mo(110) Surfaces," Journal of the American Chemical Society, 1992, vol. 114(10), pp. 3735-3743.

Cotton, F.A., "Strong Homonuclear Metal-Metal Bonds," Accounts of Chemical Research, 1969, vol. 2 (8), pp. 240-247.

Coventor Brochure "3D Nand: Challenges Beyond 96-Layer Memory Arrays", Oct. 12, 2018, pp. 1-4.

Dezelah IV, C.L., et al., "A Low Valent Metalorganic Precursor for the Growth of Tungsten Nitride Thin Films by Atomic Layer Deposition," Journal of Materials Chemistry, 2007, vol. 17, pp. 1109-1116.

Dezelah IV, C.L., et al., "Atomic Layer Deposition of Tungsten(III) Oxide Thin Films from W2(NMe2)6 and Water: Precursor-Based Control of Oxidation State in the Thin Film Material," Journal of the American Chemical Society, Aug. 2, 2006, vol. 128(30), pp. 9638-9639.

Dominique, S. et al., "An alternative to Tungsten in 3D-NAND technology", IEEE International Interconnect Technology Conference (IITC), 2021, pp. 1-3.

EP Extended European Search report dated Dec. 14, 2023, in Application No. EP20854552.5.

EP Partial Supplementary European Search report dated Sep. 13, 2023, in Application No. EP20854552.5.

Final Office Action dated May 23, 2019 issued in U.S. Appl. No. 15/948,143.

Final Office Action dated Sep. 2, 2021 issued in U.S. Appl. No. 16/947,286.

Gall D., "Electron Mean Free Path in Elemental Metals," Journal of Applied Physics, Feb. 23, 2016, vol. 119, 6 Pages.

International Preliminary Report on Patentability dated Dec. 1, 2022, in PCT Application No. PCT/US2021/033564.

International Preliminary Report on Patentability dated Mar. 10, 2022, in Application No. PCT/US2020/070434.

International Preliminary Report on Patentability dated Mar. 3, 2022, in Application No. PCT/US2020/070390.

International Search Report and Written Opinion dated Feb. 3, 2021, in Application No. PCT/US2020/055596.

(56)        References Cited

OTHER PUBLICATIONS

International Search Report and Written Opinion dated Jun. 9, 2022 in International Application No. PCT/US2022/017005 [LAMRP650WO].

International Search Report and Written Opinion dated Sep. 9, 2021 in Application No. PCT/US2021/033564.

International Preliminary Report on Patentability and Written Opinion dated Jun. 27, 2024 in PCT Application No. PCT/US2022/080705.

International Preliminary Report on Patentability and Written Opinion dated Jun. 27, 2024 in PCT Application No. PCT/US2022/080863.

International Preliminary Report on Patentability and Written Opinion dated Nov. 23, 2023 in PCT Application No. PCT/US2022/028845.

International Preliminary Report on Patentability and Written Opinion dated Sep. 6, 2024 in PCT Application No. PCT/US2023/062877.

International Preliminary Report on Patentability dated Apr. 28, 2022, in PCT Application No. PCT/US2020/055596.

International Preliminary Report on Patentability dated Aug. 12, 2021, issued in Application No. PCT/US2020/015241.

International Preliminary Report on Patentability dated Feb. 11, 2021 issued in Application No. PCT/US2019/044541.

International Preliminary Report on Patentability dated Feb. 4, 2021 in Application No. PCT/US2019/043514.

International Preliminary Report on Patentability dated Jul. 20, 2023, in PCT Application No. PCT/US2022/011053.

International Preliminary Report on Patentability dated Jun. 1, 2023, in Application No. PCT/US2021/058099.

International Preliminary Report on Patentability dated Jun. 3, 2021 in Application No. PCT/US2019/062067.

International Preliminary Report on Patentability dated Jun. 4, 2020 in Application No. PCT/US2018/061803.

International Preliminary Report on Patentability dated Mar. 9, 2006 issued in Application No. PCT/US2004/006940.

International Preliminary Report on Patentability dated Mar. 17, 2022 in PCT Application No. PCT/US2020/048951.

International Preliminary Report on Patentability dated Nov. 12, 2020 in Application No. PCT/US2019/030712.

International Preliminary Report on Patentability dated Oct. 24, 2019 in Application No. PCT/US2018/026746.

International Preliminary Report on Patentability dated Oct. 26, 2023, in PCT Application No. PCT/US2022/024295.

International Preliminary Report on Patentability dated Sep. 7, 2023, in PCT Application No. PCT/US2022/017005.

International Preliminary Report on Patentability dated Sep. 23, 2021 issued in Application No. PCT/US2020/021543.

International Search Report and Written Opinion dated Apr. 7, 2023 in PCT Application No. PCT/US2022/080705.

International Search Report and Written Opinion dated Apr. 25, 2022, for International Application No. PCT/US2022/011053.

International Search Report and Written Opinion dated Apr. 27, 2023 in PCT Application No. PCT/US2022/080863.

International Search Report and Written Opinion dated Aug. 2, 2022 in Application No. PCT/US2022/024295.

International Search Report and Written Opinion dated Aug. 11, 2023, in Application No. PCT/US2023/019795.

International Search Report and Written Opinion dated Aug. 16, 2023, in Application No. PCT/US2023/017635.

International Search Report and Written Opinion dated Aug. 16, 2023, in Application No. PCT/US2023/019800.

International Search Report and Written Opinion dated Aug. 16, 2023, in Application No. PCT/US2023/019000.

International Search Report and Written Opinion dated Aug. 19, 2019 in Application No. PCT/US2019/030712.

International Search Report and Written Opinion dated Dec. 4, 2020, in PCT Application No. PCT/US2020/048951.

International Search Report and Written Opinion dated Feb. 4, 2021, in PCT Application No. PCT/US2020/070390.

International Search Report and Written Opinion dated Feb. 7, 2024 in PCT Application No. PCT/US2023/034858.

International Search Report and Written Opinion dated Feb. 16, 2024 in PCT Application No. PCT/US2023/035873.

International Search Report and Written Opinion dated Jul. 1, 2020 in Application No. PCT/US2020/021543.

International Search Report and Written Opinion dated Jul. 23, 2024 in PCT Application No. PCT/US2024/023361.

International Search Report and Written Opinion dated Jul. 27, 2018 in Application No. PCT/US2018/026746.

International Search Report and Written Opinion dated Jun. 19, 2023, in Application No. PCT/US2023/062877.

International Search Report and Written Opinion dated Jun. 3, 2020, issued in Application No. PCT/US2020/015241.

International Search Report and Written Opinion dated Mar. 3, 2022, in Application No. PCT/US2021/058099.

International Search Report and Written Opinion dated Mar. 8, 2019 in Application No. PCT/US2018/061803.

International Search Report and Written Opinion dated Mar. 9, 2020 in Application No. PCT/US2019/062067.

International Search Report and Written Opinion dated Nov. 11, 2019 in Application No. PCT/US2019/043514.

International Search Report and Written Opinion dated Nov. 11, 2020 issued in Application No. PCT/US2020/070434.

International Search Report and Written Opinion dated Oct. 17, 20223 in PCT Application No. PCT/US2023/069018.

International Search Report and Written Opinion dated Sep. 6, 2023, in Application No. PCT/US2023/023023.

International Search Report and Written Opinion dated Sep. 7, 2022 in Application No. PCT/US2022/028845.

Ishihara, S., et al., "MOCVD of Monolayer MoS2 using Novel Molybdenum Precursor i-Pr2DADMo(CO)3," Materials Research Society, 2018, vol. 3, pp. 379-384.

Jamie, W. et al., "In Situ Atomic Layer Deposition and Electron Tunneling Characterization of Monolayer $Al_2O_3$ on Fe for Magnetic Tunnel Junctions", AIP Advances, 2018, vol. 8, No. 125218, pp. 1-9.

Jang, Y., et al., "Highly-conformal Nanocrystalline Molybdenum Nitride Thin Films by Atomic Layer Deposition as a Diffusion Barrier Against Cu," Journal of Alloys and Compounds, 2016, vol. 663, pp. 651-658.

Johnson, R.W., Hultqvist, A., Bent, S.F., "A brief review of atomic layer deposition: from fundamentals to applications", Materials today, (Jun. 1, 2014), 17(5):236-46.

JP Office Action dated Apr. 19, 2022 in Application No. JP20200504286 with English translation.

JP Office Action dated Aug. 6, 2024 in JP Application No. 2023-547183, with English Translation.

JP Office Action dated Aug. 20, 2024 in JP Application No. 2022-514153, with English Translation.

JP Office Action dated Dec. 12, 2023 in JP Application No. 2021-527153 with English Translation.

JP Office Action dated Dec. 26, 2023, in application No. JP20220141888 with English translation.

JP Office Action dated Feb. 6, 2024 in JP Application No. 2021-543355 with English translation.

JP Office Action dated Feb. 20, 2024 in JP Application No. 2023-547183 with English translation.

JP Office Action dated Feb. 27, 2024 in Application No. JP2022-522581 with English Translation.

JP Office Action dated Jul. 16, 2024 in JP Application No. 2021-527153, with English Translation.

JP Office Action dated Jun. 6, 2023 in Application No. JP2020561743 With English translation.

JP Office Action dated Jun. 11, 2024 in JP Application No. 2023-95239, with English Translation.

JP Office Action dated Mar. 5, 2024 in JP Application No. 2022-141887, with English Translation.

JP Office Action dated Mar. 19, 2024 in JP Application No. 2020-561743, with English Translation.

JP Office Action dated Mar. 26, 2024 in JP Application No. 2022-524041 with English translation.

(56)　　　　　References Cited

OTHER PUBLICATIONS

JP Office Action dated Oct. 3, 2023 in Application No. JP2022-522581 with English Translation.

JP Office Action dated Oct. 3, 2023 in Application No. JP2023-95239 with English Translation.

JP Office Action dated Sep. 3, 2024 in JP Application No. 2022-141888 with English translation.

JP Office Action dated Sep. 3, 2024 in JP Application No. 2022-509591, with English Translation.

JP Office Action dated Sep. 5, 2023, in Application No. JP2022-145721 with English translation.

Juppo, et al., "Deposition of Molybdenum Thin Films by an Alternate Supply of MoCl 5 and Zn," Journal of Vacuum Science and Technology A, vol. 16, Sep./Oct. 1998, doi: 10.1116/1.581430, pp. 2845-2850.

Karunarathne, M.C., et al., "Synthesis, Structural Characterization, and Volatility Evaluation of Zirconium and Hafnium Amidate Complexes," Journal of Organometallic Chemistry, 2017, vol. 847, pp. 204-212.

Kerrigan, M.M., et al., "Low Temperature, Selective Atomic Layer Deposition of Cobalt Metal Films Using Bis(1,4-di-tert-butyl-1,3-diazadienyl) cobalt and Alkylamine Precursors," Chemistry of Materials, 2017, vol. 29(17), pp. 7458-7466.

Kerrigan, M.M., et al., "Low Temperature, Selective Atomic Layer Deposition of Nickel Metal Thin Films," ACS Applied Materials & Interfaces, 2018, vol. 10(16), pp. 14200-14208.

Kim, K. et al., "Simulation of Residual Stress and Its Impact on a Poly-Silicon Channel for Three-Dimensional, Stacked, Vertical-NAND Flash Memories", Journal of the Korean Physical Society, 2017, vol. 70 (12), pp. 1041-1048.

Kim, T., et al., "Thermal Chemistry of Cu(I)-Iminopyrrolidinate and Cu(I)-Guanidinate Atomic Layer Deposition (ALD) Precursors on Ni(110) Single-Crystal Surfaces," Chemistry of Materials, 2013, vol. 25, pp. 3630-3639.

Klaus., et al., "Atomically Controlled Growth of Tungsten and Tungsten Nitride Using Sequential Surface Reactions," Applied Surface Science, 2000, 479-491.

Knisley, T.J., et al., "Volatility and High Thermal Stability in Mid to Late First Row Transition Metal Diazadienyl Complexes," Organometallics, 2011, vol. 30(18), pp. 5010-5017.

Korean First Notification of Provisional Rejection, dated Dec. 8, 2010, issued in Application No. KR 2004-0036346.

Korean Office Action, dated Jun. 13, 2011, issued in Application No. KR 2011-0032098.

Korean Second Notification of Provisional Rejection, dated Aug. 25, 2011, issued in Application No. KR 2004-0036346.

KR Notice of Allowances dated Aug. 28, 2024 in KR Application No. 10-2023-7028915 with English Translation.

KR Office Action dated Dec. 15, 2023 in KR Application No. 10-2023-7028915, with English Translation.

KR Office Action dated Feb. 21, 2022, in Application No. KR10-2017-0102113 with English Translation.

KR Office Action dated Jan. 27, 2023 in Application No. KR10-2017-0102113 with English Translation.

KR Office Action dated Jul. 28, 2023, in Application No. KR10-2023-0081299 with English Translation.

KR Office Action dated Jun. 27, 2024 in KR Application No. 10-2023-0081299, with English Translation.

KR Office Action dated Mar. 1, 2024 in KR Application No. 10-2021-7018803, with English Translation.

KR Office Action dated Mar. 29, 2024 in KR Application No. 10-2020-7017697 with English translation.

KR Office Action dated May 7, 2024 in KR Application No. 10-2020-7034800, with English Translation.

KR Office Action dated May 28, 2024 in KR Application No. 10-2021-7006202 with English translation.

KR Office Action dated May 30, 2022, in Application No. KR10-2019-7033130 With English Translation.

KR Office Action dated Nov. 14, 2023, in KR Application No. 10-2022-7031314 with English Translation.

KR Office Action dated Oct. 27, 2022 in Application No. KR10-2022-7026373 with English translation.

KR Office Action dated Sep. 27, 2022, in Application No. KR10-2017-0102113 with English translation.

Kurek, A. et al., "Recent Advances Using Guanidinate Ligands for Chemical Vapour Deposition (CVD) and Atomic Layer Deposition (ALD) Applications," Australian Journal of Chemistry, Jun. 2014, vol. 67, pp. 989-996.

Lee, B. et al., "ALD Tungsten Solves Capacity Challenges in 3D NAND Device Manufacturing", Lam Brochure, Jan. 2019, pp. 1-4.

Li, Z. et al., "Atomic Layer Deposition of Ultrathin Copper Metal Films from a Liquid Copper(I) Amidinate Precursor", Journal of the Electrochemical Society, 2006, vol. 153, No. 11, pp. C787-C794.

Lim, B. et al., "Atomic Layer Deposition of Transition Metals", Nature Materials, 2003, vol. 2, pp. 749-754.

Lin, S. et al., "Effect of Nitrogen on the Physical Properties and work Function of $MoN_x$ Cap Layers on $HfO_2$ Gate Dielectrics", ECS Journal of Solid State Science and Technology, 2014, vol. 3, No. 12, pp. N161-N165.

Majumder et al. "Investigation on the diffusion barrier properties of sputtered Mo/W-N thin films in Cu interconnects," Applied Physics Letters, vol. 91 (2007), pp. 162108-1-162108-3.

Makela, M., et al., "Thermal Atomic Layer Deposition of Continuous and Highly Conducting Gold Thin Films," Chemistry of Materials, 2017, vol. 29, pp. 6130-6136.

McCain, M.N. et al., "Aerosol-Assisted Chemical Vapor Deposition of Lubricating MoS2 Films. Ferrous Substrates and Titanium Film Doping", Chemistry of Materials, 2008, vol. 20, No. 16, pp. 5438-5443.

Miikkulainen, V. et al., "Atomic Layer Deposition of Molybdenum Nitride from Bis(tert-butylimido)-bis(dimethylamido)molybdenum and Ammonia onto Several Types of Substrate Materials with Equal Growth per Cycle", Chemistry of Materials, 2007, vol. 19, pp. 263-269.

Miikkulainen, V. et al., "Bis(tert-butylimido)-bis(dialkylamido)Complexes of Molybdenum as Atomic Layer Deposition (ALD) Precursors for Molybdenum Nitride: the Effect of the Alkyl Group", Chemical Vapor Deposition, 2008, vol. 14, pp. 71-77.

Mohimi, E, et al., "Low temperature chemical vapor deposition of superconducting molybdenum carbonitride thin films", Journal of Vacuum Science & Technology A , 2019, vol. 37, No. 2, 021503, 6 pages.

Muhtade, M., et al., "Time Influence on Thickness and Grains for Molybdenum Thin Film," 2017, e-ISSN: 2289-8131, vol. 9, No. 2-13.

Nandi, D.K. et al., "Atomic Layer Deposited Molybdenum Nitride Thin Film: A Promising Anode Material for Li Ion Batteries", ACS Applied Material Interfaces, 2014, vol. 6, pp. 6606-6615.

Notice of Allowance dated Apr. 27, 2020 issued in U.S. Appl. No. 16/676,169.

Notice of Allowance dated Aug. 6, 2019 issued in U.S. Appl. No. 15/948,143.

Office Action dated Apr. 27, 2021 issued in U.S. Appl. No. 16/947,286.

Office Action dated Aug. 12, 2021 issued in U.S. Appl. No. 16/764,812.

Office Action dated Feb. 4, 2019 issued in U.S. Appl. No. 15/948,143.

Office Action Requirement for Restriction/Election dated Sep. 22, 2021 issued in U.S. Appl. No. 17/250,452.

Otsuka, S. et al., "A Novel Molybdenum Thiolato Compound, Tetrakis(tert-butylthiolato)molybdenum(IV). Preparation and Crystal and Molecular Structure" Journal of American chemistry society, 1981, vol. 103, pp. 3011-3014.

Ouyang, T., et al., "A Surface Chemistry Route to Molybdenum Sulfide and Germanide Films Using the Single-Source Precursor Tetrakis(diethylaminodithiocarbomato)molybdate(IV)," The Journal of Physical Chemistry B, 2004, vol. 108(5), pp. 17537-17545.

PCT Search Report and Written Opinion, dated Jan. 19, 2005, issued in PCT/US2004/006940.

Pol, V. G., et al., "Fabrication of Magnetic Nanoparticles Using Rapet Technique With or Without Employing External Magnetic Field," The Journal of Physical Chemistry C, 2008, vol. 112, pp. 6627-6637.

(56) References Cited

OTHER PUBLICATIONS

Qu Jingxin, et al., "Surface Engineering Handbook," Chemical Industry Publishing House, Mar. 31, 1998, p. 277.

Ranade, P. et al., "Work Function Engineering of Molybdenum Gate Electrodes by Nitrogen Implantation", Electrochemical and Solid-State Letters, 2001, vol. 4, No. 11, pp. G85-G87.

Seghete, D. et al., Molybdenum Atomic Layer Deposition Using MoF6 and Si2H6 as the Reactants, Chemistry of Materials, 2011, vol. 23 No. 7, pp. 1668-1678.

SG Office Action dated Oct. 11, 2023, in application No. SG11202201453T.

SG Office Action dated Sep. 19, 2023, in application No. SG11202202087P.

SG Search Report and Written Opinion dated Feb. 10, 2023 in Application No. SG11202109796Q.

SG Written Opinion dated Oct. 4, 2023 in Application No. SG11202109796Q.

Shimizu, H. et al., "Precursor-based designs of nano-structures and their processing for Co(W) alloy films as a single layered barrier/liner layer in future Cu-interconnect", Journal of Materials Chemistry C, 2015, vol. 3, pp. 2500-2510.

Shirazi, M., et al., "Initial Stage of Atomic Layer Deposition of 2D-MoS$_2$ on a SiO$_2$ surface: a DFT study," Physical Chemistry Chemical Physics, 2018, vol. 20 (24), pp. 1-18.

Singapore Written Opinion dated Mar. 15, 2023 issued in Application No. SG11202108217U.

Specification of U.S. Appl. No. 62/425,704 (Electronically filed Nov. 23, 2016).

Stephenson T A., et al., "487. Molybdenum(II) Carboxylates," Journal of the Chemical Society, 1964, pp. 2538-2541.

Sun Yicai, et al., "Design Manufacturing and Application," Metallurgical Industry Publishing House, Apr. 30, 2000, p. 166.

TW Office Action dated Apr. 24, 2024 in TW Application No. 109130013, With English Translation.

TW Office Action dated Aug. 16, 2022, in Application No. TW107141042 with English translation.

TW Office Action dated Aug. 31, 2023, in Application No. TW109102778 with English translation.

TW Office Action dated Dec. 5, 2023 in TW Application No. 109107661 with English translation.

TW Office Action dated Dec. 21, 2023 in Application No. TW108126326 with English translation.

TW Office Action dated Feb. 10, 2023 in Application No. TW107112210 with English translation.

TW Office Action dated May 9, 2024 in TW Application No. 109107661 with English translation.

TW Office Action dated May 22, 2024 in TW Application No. 109135654, with English Translation.

TW Office Action dated May 24, 2022, in Application No. TW20180112210 with English translation.

TW Office Action dated Oct. 18, 2021, in application No. TW107112210 with English translation.

TW Office Action dated Oct. 19, 2023 in Application No. TW107112210 with English translation.

TW Office Action dated Sep. 14, 2022, in Application No. TW107112210 with English translation.

U.S Advisory Action dated May 3, 2022 in U.S. Appl. No. 16/764,812.

U.S. Advisory Action dated Oct. 18, 2022, in U.S. Appl. No. 17/250,452.

U.S. Appl. No. 17/763,529, inventors Schloss et al., filed Mar. 24, 2022.

U.S. Corrected Notice of Allowance dated Feb. 16, 2022, in U.S. Appl. No. 16/724,231.

U.S. Corrected Notice of Allowance dated May 11, 2022, in U.S. Appl. No. 16/724,231.

U.S. Corrected Notice of Allowance dated May 15, 2024 in U.S. Appl. No. 17/250,503.

U.S. Final office Action dated Jul. 25, 2022 in U.S. Appl. No. 17/250,452.

U.S. Final Office Action dated Feb. 2, 2023 in U.S. Appl. No. 17/436,944.

U.S. Final Office Action dated Apr. 12, 2024 in U.S. Appl. No. 17/814,206.

U.S. Final Office Action dated Feb. 12, 2024 in U.S. Appl. No. 17/589,416.

U.S. Final Office Action dated Jan. 31, 2022 in U.S. Appl. No. 16/764,812.

US Final Office Action, dated Jul. 14, 2005, issued in U.S. Appl. No. 10/649,351.

U.S. Final office Action dated Jun. 26, 2023 in U.S. Appl. No. 17/589,416.

U.S. Final Office Action dated Mar. 1, 2023 in U.S. Appl. No. 17/250,452.

US Final Office Action dated Mar. 29, 2021 issued in U.S. Appl. No. 16/724,231.

U.S. Final Office Action dated May 8, 2024 in U.S. Appl. No. 17/250,452.

U.S. Final Office Action dated May 9, 2024 in U.S. Appl. No. 17/814,207.

U.S. Final Office Action dated May 31, 2023, in U.S. Appl. No. 17/814,207.

U.S. Final Office Action dated Nov. 30, 2022 in U.S. Appl. No. 16/764,812.

U.S. Final office Action dated Sep. 14, 2023 in U.S. Appl. No. 17/662,220.

U.S. Non Final Office Action dated Mar. 21, 2022, in U.S. Appl. No. 17/250,452.

U.S. Non-Final Office Action dated Aug. 7, 2024 in U.S. Appl. No. 18/310,523.

U.S. Non-Final Office Action dated Aug. 29, 2023, in U.S. Appl. No. 17/310,293.

U.S. Non-Final Office Action dated Aug. 31, 2023, in U.S. Appl. No. 17/250,503.

U.S. Non-Final Office Action dated Dec. 15, 2021 in U.S. Appl. No. 17/250,014.

U.S. Non-Final Office Action dated Feb. 2, 2023 in U.S. Appl. No. 17/589,416.

U.S. Non-Final Office Action dated Feb. 2, 2023 in U.S. Appl. No. 17/662,220.

U.S. Non-Final Office Action dated Feb. 29, 2024 in U.S. Appl. No. 17/294,378.

U.S. Non-Final Office Action dated Jan. 17, 2024 in U.S. Appl. No. 17/814,207.

U.S. Non-Final Office Action dated Jul. 20, 2023, in U.S. Appl. No. 17/814,209.

U.S. Non-Final Office Action dated Jul. 24, 2024 in U.S. Appl. No. 17/763,529.

U.S. Non-Final Office Action dated Jun. 20, 2023, in U.S. Appl. No. 17/250,452.

U.S. Non-Final Office Action dated Jun. 21, 2024 in U.S. Appl. No. 17/639,846.

U.S. Non-Final Office Action dated Jun. 21, 2024 in U.S. Appl. No. 18/379,397.

U.S. Non-Final Office Action dated Jun. 24, 2022, in U.S. Appl. No. 17/436,944.

U.S. Non-Final Office Action dated May 16, 2022 in U.S. Appl. No. 16/764,812.

U.S. Non-Final Office Action dated May 23, 2024 in U.S. Appl. No. 17/662,220.

U.S. Non-Final Office Action dated Nov. 6, 2023, in U.S. Appl. No. 17/814,206.

U.S. Non-Final Office Action dated Nov. 19, 2021, in U.S. Appl. No. 17/250,452.

U.S. Non-Final Office Action dated Nov. 30, 2022 in U.S. Appl. No. 17/814,207.

U.S. Non-Final Office Action dated Nov. 30, 2023 in U.S. Appl. No. 17/250,452.

U.S. Non-Final Office Action dated Oct. 26, 2023, in U.S. Appl. No. 17/589,416.

U.S. Non-Final Office Action dated Sep. 5, 2024 in U.S. Appl. No. 17/814,206.

(56) References Cited

OTHER PUBLICATIONS

U.S. Notice of Allowance dated Apr. 4, 2024 in U.S. Appl. No. 17/310,293.
U.S. Notice of Allowance dated Aug. 3, 2023, in U.S. Appl. No. 17/436,944.
U.S. Notice of Allowance dated Feb. 7, 2024 in U.S. Appl. No. 17/250,503.
U.S. Notice of Allowance dated Feb. 2, 2022 in U.S. Appl. No. 16/724,231.
U.S. Notice of Allowance dated Jan. 2, 2024 in U.S. Appl. No. 17/310,293.
U.S. Notice of Allowance dated Jul. 3, 2024 in U.S. Appl. No. 17/294,378.
U.S. Notice of Allowance dated Jul. 14, 2023 in U.S. Appl. No. 17/436,944.
US Notice of Allowance, dated Jul. 21, 2006, issued in U.S. Appl. No. 10/649,351.
U.S. Notice of Allowance dated Jun. 7, 2022 in U.S. Appl. No. 17/250,014.
U.S. Notice of Allowance dated Mar. 27, 2024 in U.S. Appl. No. 17/814,209.
U.S. Notice of Allowance dated Nov. 14, 2023 in U.S. Appl. No. 17/814,209.
U.S. Notice of Allowance dated Oct. 4, 2023, in U.S. Appl. No. 17/436,944.
U.S. Notice of Allowance dated Sep. 16, 2022 in U.S. Appl. No. 17/250,014.
US Notice of allowance dated Sep. 29, 2021 issued in U.S. Appl. No. 16/724,231.
US Office Action, dated Dec. 30, 2005, issued in U.S. Appl. No. 10/649,351.
US Office Action, dated Feb. 8, 2005, issued in U.S. Appl. No. 10/649,351.
US Office Action dated Sep. 22, 2020 issued in U.S. Appl. No. 16/724,231.
US Office Action Restriction/Election dated Sep. 9, 2021 issued in U.S. Appl. No. 17/250,014.
U.S. Appl. No. 18/253,038, inventors Lai C.S, et al., filed May 16, 2023.
U.S. Appl. No. 18/286,994, inventors Thombare S V, et al., filed Oct. 13, 2023.
U.S. Appl. No. 18/559,783, inventor Bhadauriya S, filed Nov. 23, 2023.
U.S. Appl. No. 18/714,506, inventors Mandia D.J., et al., filed May 29, 2024.
U.S. Appl. No. 18/716,846, inventors Mandia D.J, et al., filed Jun. 5, 2024.
U.S. Appl. No. 18/799,905, inventors Thombare S.V, et al., filed Aug. 9, 2024.
U.S. Appl. No. 18/837,560, inventors Hsieh Y, et al., filed Aug. 9, 2024.
U.S. Appl. No. 62/362,582, inventors Meng et al., filed Jul. 14, 2016.
U.S. Restriction requirement dated May 13, 2024, in U.S. Appl. No. 18/310,523.
U.S. Supplemental Notice of Allowance dated Dec. 14, 2022 in U.S. Appl. No. 17/250,014.
Werndrup P., et al., A Single-source-precursor Approach to Late Transition Metal Molybdate Materials: the Structural Role of Chelating Ligands in the Formation of Heterometallic Heteroleptic Alkoxide Complexes, European Journal of Inorganic Chemistry, 2006, vol. 2006 (7), 1413-1422.
Zhao, Y., et al., "Synthesis and Structures of Mono- and Dinuclear Molybdenum Complexes with Reduced α-Diimine Ligands," European Journal of Inorganic Chemistry, 2016, pp. 5411-5417.
CAS Registry No. 500120-09-2, CAS SciFinder, 2025, 2 Pages.
CAS Registry No. 749862-34-8, CAS SciFinder, 2025, 2 Pages.
CN Office Action dated Feb. 20, 2025 in CN Application No. 201980038600.8, with English Translation.

CN Office Action dated Feb. 20, 2025 in CN Application No. 201980076277.3 with English translation.
CN Office Action dated Feb. 28, 2025 in CN Application No. 201980049916.7, with English Translation.
CN Office Action dated Mar. 6, 2025 in CN Application No. 202080059499.7, with English Translation.
CN Office Action dated May 28, 2025 in CN Application No. 201880074995.2 with English translation.
CN Office Action dated May 28, 2025 in CN Application No. 201980038600.8 with English translation.
CN Office Action dated May 29, 2025 in CN Application No. 202080072306.1, with English Translation.
CN Office Action dated May 30, 2025 in CN Application No. 202080059499.7, with English Translation.
CN Office Action dated May 30, 2025 in CN Application No. 202080062173.X, with English Translation.
CN Office Action dated Nov. 22, 2024 in CN Application No. 201980051278.2, with English Translation.
CN Office Action dated Nov. 29, 2024 in CN Application No. 201880074995.2, with English Translation.
CN Office Action dated Oct. 17, 2024 in CN Application No. 202080059499.7 with English translation.
Hartley F R., et al., "Foundations of Metal-Organic Chemistry", Chemical Industry Press, Nov. 1982, pp. 58-59 (5 Pages).
International Preliminary Report on Patentability and Written Opinion dated Apr. 24, 2025 in PCT Application No. PCT/US2023/034858.
International Preliminary Report on Patentability and Written Opinion dated Jan. 2, 2025 in PCT Application No. PCT/US2023/069018.
International Preliminary Report on Patentability and Written Opinion dated May 8, 2025 in PCT Application No. PCT/US2023/035873.
International Preliminary Report on Patentability and Written Opinion dated Nov. 14, 2024 in PCT Application No. PCT/US2023/019795.
International Preliminary Report on Patentability and Written Opinion dated Oct. 17, 2024 in PCT Application No. PCT/US2023/017635.
International Preliminary Report on Patentability and Written Opinion dated Oct. 23, 2025 in PCT Application No. PCT/US2024/023361.
International Preliminary Report on Patentability and Written Opinion dated Oct. 31, 2024 in PCT Application No. PCT/US2023/019000.
International Preliminary Report on Patentability and Written Opinion dated Nov. 7, 2024 in PCT Application No. PCT/US2023/019800.
International Search Report and Written Opinion dated Jun. 11, 2025 in PCT Application No. PCT/US2025/017720.
International Search Report and Written Opinion dated Oct. 22, 2024 in PCT Application No. PCT/US2024/037234.
Jiang P., et al., "Dependence of Crystal Structure and Work Function of WNX Films on the Nitrogen Content," Applied Physics Letters, 2006, vol. 89, (122107) pp. 1-3.
JP Decision to Grant and Search Report dated Jul. 1, 2025 in JP Application No. 2021-527153, with English translation.
JP Notice of Allowances dated Oct. 1, 2024 in JP Application No. 2021-543355 with English translation.
JP Notice of Allowances dated Oct. 15, 2024 in JP Application No. 2021-552861 with English translation.
JP Office Action dated Dec. 2, 2025 in JP Application No. 2023-539751, with English Translation.
JP Office Action dated Jan. 7, 2025 in JP Application No. 2021-527153 with English translation.
JP Office Action dated Jan. 28, 2025 in JP Application No. 2022-571128, with English Translation.
JP Office Action dated Jul. 8, 2025 in JP Application No. 2022-514153, with English Translation.
JP Office Action dated Jun. 3, 2025 in JP Application No. 2022141888, with English Translation.
JP Office Action dated Jun. 3, 2025 in JP Application No. 2022509591, with English Translation.

(56) References Cited

OTHER PUBLICATIONS

JP Office Action dated Mar. 4, 2025 in JP Application No. 2022-514153, with English Translation.
JP Office Action dated May 7, 2025 in JP Application No. 2022-141887, with English Translation.
JP Office Action dated Nov. 4, 2025 in JP Application No. 2023-528357, with English Translation.
JP Office Action dated Nov. 12, 2024 in JP Application No. 2022-522581 with English translation.
JP Office Action dated Oct. 29, 2024 in JP Application No. 2022-141887 with English translation.
JP Office Action dated Sep. 2, 2025 in JP Application No. 2020-561743, with English Translation.
JP Office Action dated Sep. 9, 2025 in JP Application No. 2022-571128, with English Translation.
JP Office Action dated Sep. 16, 2025 in JP Application No. 2024-114404, with English Translation.
Keyan Z., "Essays on Organic Chemistry: Homogeneous Catalytic Reaction of Unsaturated Hydrocarbons," Higher Education Press, May 1989, vol. 3, p. 11 (4 Pages).
KR Decision to Grant and Search Report dated Aug. 26, 2025 in KR Application No. 10-2021-7032632, with English translation.
KR Decision to Grant and Search Report dated Oct. 24, 2025 in KR Application No. 10-2022-7009362, with English translation.
KR Decision to Grant and Search Report dated Oct. 30, 2025 in KR Application No. 10-2021-7006202, with English translation.
KR Notice of Allowance dated Feb. 11, 2025 in KR Application No. 10-2020-7034800, with English Translation.
KR Notice of Allowance dated Nov. 25, 2024 in KR Application No. 10-2023-0081299, with English Translation.
KR Notice of Allowances dated Jan. 8, 2025 in KR Application No. 10-2022-7031314 with English Translation.
KR Office Action dated Apr. 21, 2025 in KR Application No. 10-2021-7018803, with English Translation.
KR Office Action dated Apr. 22, 2025 in KR Application No. 10-2021-7026960, with English Translation.
KR Office Action dated Aug. 26, 2025 in KR Application No. 10-2021-7005949, with English Translation.
KR Office Action dated Dec. 3, 2024 in KR Application No. 10-2021-7032632 with English Translation.
KR Office Action dated Dec. 20, 2024 in KR Application No. 10-2022-7015736, with English Translation.
KR Office Action dated Dec. 31, 2024 in KR Application No. 10-2021-7006202, with English Translation.
KR Office Action dated Feb. 21, 2025 in KR Application No. 10-2022-7009362, with English Translation.
KR Office Action dated Feb. 26, 2025 in KR Application No. 10-2020-7017697, with English Translation.
KR Office Action dated Jul. 8, 2025 in KR Application No. 10-2022-7045710, with English Translation.
KR Office Action dated Jul. 9, 2025 in KR Application No. 10-2022-7011026, with English Translation.
KR Office Action dated Jul. 17, 2025 in KR Application No. 10-2022-7045707, with English Translation.
KR Office Action dated Nov. 21, 2024 in KR Application No. 10-2021-7005949 with English Translation.
KR Office Action dated Oct. 20, 2025 in KR Application No. 10-2022-7044687, with English Translation.
KR Office Action dated Oct. 28, 2024 in KR Application No. 10-2021-7018803 with English Translation.
KR Office Action dated Sep. 16, 2025 in KR Application No. 10-2022-7015736, with English Translation.
KR Office Action dated Sep. 23, 2025 in KR Application No. 10-2022-7044028, with English Translation.
KR Office Action dated Sep. 26, 2024 in KR Application No. 10-2022-7031314, with English Translation.
SG Search Report and Written Opinion dated Aug. 22, 2024 in SG Application No. 11202203845Q.
SG Written Opinion dated Jan. 9, 2025 in SG Application No. 11202202087P.
SG Written Opinion dated Mar. 4, 2025 in SG Application No. 11202201453T.
SG Written Opinion dated Mar. 28, 2025 in SG Application No. 11202203845.
Stoffelbach F., et al., "A Bis(Diazadiene) Adduct of MoCI2: Mononuclear, Octahedral, Undistorted and Diamagnetic," European Journal of Inorganic Chemistry, 2004, (4), pp. 726-731.
Stoffelbach F., et al., "Half-Sandwich Molybdenum(III) Compounds Containing Diazadiene Ligands and Their Use in the Controlled Radical Polymerization of Styrene," Journal of Organometallic Chemistry, Dec. 2002, vol. 663 (1-2), pp. 269-276.
TW Office Action and Search Report dated Aug. 28, 2025 in TW Application No. 111113974, with English Translation.
TW Office Action and Search Report dated Jul. 2, 2025 in TW Application No. 110142342, with English Translation.
TW Office Action and Search Report dated May 13, 2025 in TW Application No. 111100209, with English Translation.
TW Office Action and Search Report dated Sep. 15, 2025 in TW Application No. 111106158, with English Translation.
TW Office Action dated Apr. 15, 2025 in TW Application No. 110118417, with English Translation.
U.S. Corrected Notice of Allowance dated Mar. 6, 2025 in U.S. Appl. No. 17/639,846.
U.S. Final Office Action dated Aug. 29, 2025 in U.S. Appl. No. 18/799,905.
U.S. Final Office Action dated Feb. 4, 2025 in U.S. Appl. No. 18/310,523.
U.S. Final Office Action dated Jan. 3, 2025 in U.S. Appl. No. 17/662,220.
U.S. Final Office Action dated. Nov. 22, 2024 in U.S. Appl. No. 17/639,846.
U.S. Final Office Action dated Oct. 7, 2025 in U.S. Appl. No. 18/379,397.
U.S. Final Office Action dated Oct. 10, 2024 in U.S. Appl. No. 18/379,397.
U.S. Final Office Action dated Sep. 2, 2025 in U.S. Appl. No. 18/286,994.
U.S. Non-Final Office Action dated Apr. 9, 2025 in U.S. Appl. No. 18/286,994.
U.S. Non-Final Office Action dated Aug. 27, 2025 in U.S. Appl. No. 18/253,038.
U.S. Non-Final Office Action dated Jul. 23, 2025 in U.S. Appl. No. 18/559,783.
US Non-Final Office Action dated Jul. 29, 2025 in U.S. Appl. No. 17/999,255.
U.S. Non-Final Office Action dated Mar. 21, 2025 in U.S. Appl. No. 18/379,397.
US Non-Final Office Action dated May 6, 2025 in U.S. Appl. No. 18/799,905.
U.S. Non-Final Office Action dated May 23, 2025 in U.S. Appl. No. 18/310,523.
U.S. Non-Final Office Action dated Sep. 4, 2025 in U.S. Appl. No. 18/626,278.
U.S. Notice of Allowance dated Dec. 4, 2025 in U.S. Appl. No. 18/286,994.
U.S. Notice of Allowance dated Feb. 11, 2025 in U.S. Appl. No. 17/763,529.
U.S. Notice of Allowance dated Feb. 21, 2025 in U.S. Appl. No. 17/763,529.
U.S. Notice of Allowance dated Feb. 26, 2025 in U.S. Appl. No. 17/639,846.
U.S. Notice of Allowance dated Mar. 5, 2025 in U.S. Appl. No. 17/814,206.
U.S. Notice of Allowance dated Mar. 21, 2025 in U.S. Appl. No. 17/662,220.
U.S. Notice of Allowance dated Nov. 18, 2025 in U.S. Appl. No. 18/559,783.
U.S. Appl. No. 18/877,501, inventors Fox A.R et al., filed Dec. 20, 2024.
U.S. Appl. No. 19/119,205, inventors Mandia D.J et al., filed Apr. 8, 2025.
U.S. Appl. No. 19/124,236, Inventors Lee et al., filed filed Apr. 24, 2025.

(56) References Cited

OTHER PUBLICATIONS

U.S. Appl. No. 19/473,869, inventors Mandia D.J et al., filed Oct. 9, 2025.
U.S. Restriction Requirement dated Apr. 10, 2025 in U.S. Appl. No. 17/999,255.
U.S. Restriction Requirement dated Jun. 13, 2025 in U.S. Appl. No. 18/626,278.

\* cited by examiner

100

110

112a

108

104

102

100

110

112b

108

106

104

102

Provide substrate having
an oxide surface and/or barrier
layer surface (301)

Modulate oxide-metal interface to
prevent defects in the oxide (360)

Form metal layer over
the substrate (370)

NON-METAL INCORPORATION IN MOLYBDENUM ON DIELECTRIC SURFACES

INCORPORATION BY REFERENCE

A PCT Request Form is filed concurrently with this specification as part of the present application. Each application that the present application claims benefit of or priority to as identified in the concurrently filed PCT Request Form is incorporated by reference herein in their entireties and for all purposes.

BACKGROUND

Tungsten (W) film deposition using chemical vapor deposition (CVD) techniques is an integral part of semiconductor fabrication processes. For example, W films may be used as low resistivity electrical connections in the form of horizontal interconnects, vias between adjacent metal layers, and contacts between a first metal layer and devices on a silicon substrate. Tungsten films may also be used in various memory applications, including in formation of buried wordline (bWL) architectures for dynamic random access memory (DRAM), word lines for 3D NAND, and logic applications. However, the continued decrease in feature size and film thickness brings various challenges including high resistivity for thinner films. Other metals such as molybdenum (Mo) are being evaluated as low resistivity replacements for W.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Provided herein are methods and apparatuses for processing substrates. One aspect involves a method for processing substrates, the method including: providing a substrate having an oxide material thereon; depositing at least a portion of an elemental molybdenum layer over the oxide material using a first atomic layer deposition (ALD) process by exposing the oxide material to alternating pulses of a first oxygen-containing molybdenum precursor and a first reducing agent using a first set of process conditions; and modulating the first set of process conditions to increase non-molybdenum content when depositing the portion of the elemental molybdenum layer.

In various embodiments, the first set of process conditions includes using a flow rate of at least about 1000 sccm of the first reducing agent during the first ALD process.

In various embodiments, the first set of process conditions include exposing the substrate to the first reducing agent for at least 1 second during a cycle of the first ALD process.

In various embodiments, the method also includes prior to depositing the portion of the elemental molybdenum layer, exposing the oxide material to a soak gas such as boron-containing gases, tungsten-containing gases, fluorine-containing gases, oxygen-containing gases, chlorine-containing gases, and combinations thereof.

In various embodiments, the method also includes, prior to depositing the portion of the elemental molybdenum layer, exposing the oxide material to alternating pulses of a boron-containing gas and a tungsten-containing gas. In some embodiments, the boron-containing gas includes diborane and the tungsten-containing gas includes tungsten hexafluoride.

In various embodiments, the method also includes prior to depositing the portion of the elemental molybdenum layer, depositing a first layer on the oxide material using a second oxygen-containing molybdenum precursor and a second reducing agent using a second ALD process on the oxide material under a second set of process conditions. In some embodiments, the second reducing agent is a nitrogen-containing gas, hydrogen, or combinations thereof.

In some embodiments, the second set of process conditions includes depositing at least the portion of the elemental molybdenum layer at a substrate temperature less than about 400° C. In some embodiments, at least one of the first and the second oxygen-containing molybdenum precursor is a molybdenum oxyhalide. In some embodiments, the first oxygen-containing molybdenum precursor is a molybdenum oxyhalide, and the first set of process conditions includes using a hydrogen to molybdenum oxyhalide precursor ratio of between about 100:1 and about 10,000:1.

In some embodiments, the second set of process conditions includes increasing flow of a nitrogen-containing gas during the second ALD process.

In some embodiments, the method also includes flowing nitrogen during depositing of the first layer.

In some embodiments, the method also includes soaking the substrate having the oxide material thereon with a soak gas prior to depositing the first layer. The soak gas may be any one or more of oxygen, ammonia, or nitrogen.

In some embodiments, the method also includes soaking the substrate having the oxide material thereon with a soak gas after depositing the first layer.

In some embodiments, less than half of the first layer is converted to a converted elemental molybdenum layer during or prior to the first ALD process. The converted elemental molybdenum layer may contain more than 1 (atomic) % impurities. The impurities may be any of oxygen, chlorine, nitrogen, and combinations thereof.

In various embodiments, the first layer is a crystalline layer.

In various embodiments, the first layer is an amorphous layer.

In various embodiments, the first ALD process and the second ALD process are performed in the same chamber and without exposure to air.

In various embodiments, the first layer is a template for metal grain growth in the elemental molybdenum layer.

In various embodiments, the second ALD process is performed at a temperature less than 400° C. In some embodiments, the first ALD process is performed at the same temperature as the second ALD process. In some embodiments, the elemental molybdenum layer is a gradient film, such that at least a first set of cycles of the first ALD process is performed at a temperature less than about 400° C. and at least a last set of cycles of the first ALD process is performed at a temperature greater than 400° C.

In various embodiments, deposition of the first layer and deposition of the elemental molybdenum layer are performed in the same chamber. In some embodiments, deposition of the first layer and deposition of the elemental molybdenum layer are performed in different stations of the same chamber.

In various embodiments, deposition of the first layer is performed in a first chamber and deposition of the elemental molybdenum layer is performed in a second chamber.

In various embodiments, the method also includes exposing the first layer to air prior to deposition of the elemental molybdenum layer.

In various embodiments, the elemental molybdenum layer is crystalline.

In various embodiments, the elemental molybdenum layer contains less than 1 (atomic) % impurities.

In various embodiments, the elemental molybdenum layer is elemental molybdenum.

Another aspect involves an apparatus for processing substrates, the apparatus including: first and second process chambers each configured to house a substrate; a substrate support in each of the first and the second process chambers; gas inlets configured to direct gas into each of the first and the second process chambers via one or more showerheads; a heater configured to heat the substrate support in each process chamber; and a controller including program instructions for: (a) causing sequentially inletting of an oxygen-containing molybdenum precursor and a nitrogen-containing gas into the first process chamber while a substrate is housed in the first process chamber; (b) after (a), causing transfer of the substrate to the second process chamber; (c) after (b), causing sequentially inletting of an oxygen-containing molybdenum precursor and hydrogen into the second process chamber while the substrate is housed in the second process chamber; and (d) causing implementation of one or more of the program instructions selected from the group consisting of: causing nitrogen to be inletted into the first process chamber when the substrate is housed in the first process chamber, causing temperature of the substrate support in the second process chamber to be at two different temperatures while the substrate is housed in the second process chamber, causing delivery of a soak gas to the first process chamber before or after sequentially inletting the oxygen-containing molybdenum precursor and the nitrogen-containing gas into the first process chamber, and causing reduced flow of hydrogen into the second process chamber while the substrate is housed in the second process chamber.

In various embodiments, at least one of the one or more showerheads is a single plenum showerhead.

In various embodiments, at least one of the one or more showerheads is a dual plenum showerhead.

In various embodiments, the process chamber is a chamber within a multi-chamber apparatus.

Another aspect involves an apparatus for processing substrates, the apparatus including: a process chamber configured to house a substrate; a substrate support in the process chambers; a first gas box including a gas source for containing hydrogen gas; a second gas box including a gas source for containing a molybdenum-containing gas; a third gas box including a gas source for containing a boron-containing or tungsten-containing gas; gas inlets configured to direct gas from each of the first gas box, second gas box, and third gas box into the process chamber via one or more showerheads; and a heater configured to heat the substrate support in each process chamber.

In various embodiments, at least one of the one or more showerheads is a single plenum showerhead.

In various embodiments, at least one of the one or more showerheads is a dual plenum showerhead.

In various embodiments, the process chamber is a chamber within a multi-chamber apparatus.

These and other aspects are described further below with reference to the drawings.

DETAILED DESCRIPTION

Figure 1A:
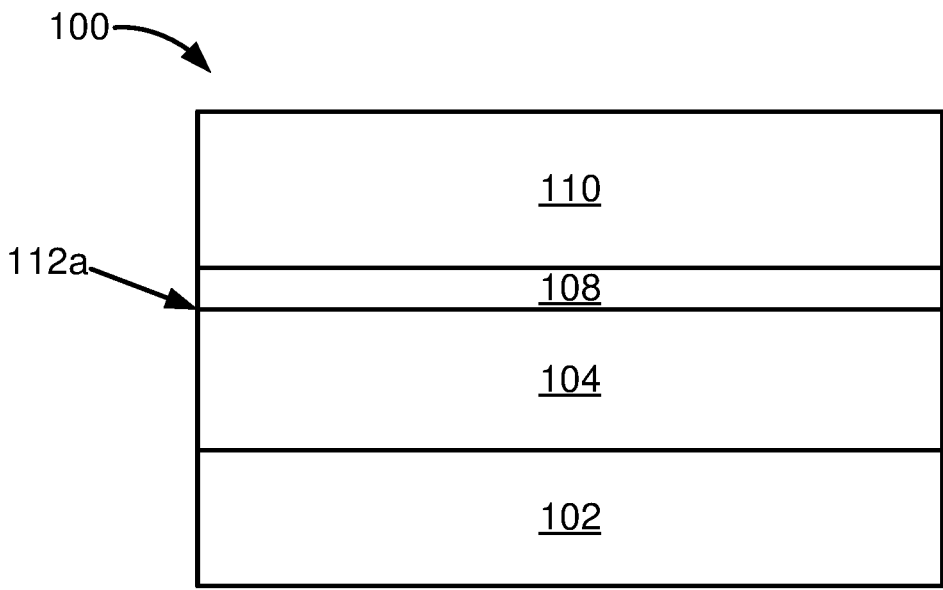
FIGS. 1A and 1B are schematic examples of material stacks that include a nucleation layer as a template for metal growth.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor fabrication processes involve formation of 3D NAND devices. Metallization of the gate contact in the 3D NAND transistor involves deposition of a metal that is highly conductive and has low resistivity, particularly in small features. Tungsten (W) has been used for metallization in 3D NAND devices and deposition of W for gate contacts involves formation of a titanium nitride (TiN) liner layer followed by a W nucleation layer and finally W bulk layer. The TiN layer is used as both a barrier layer and an adhesion layer to facilitate effective nucleation of the W nucleation layer, which is used to facilitate formation of high quality bulk W. The nucleation layer often includes boron from a boron-containing reactant used to deposit the nucleation layer, and has higher resistivity than bulk W. Because many layers are deposited, the available space for depositing high quality, low resistance bulk W is low, especially as devices continue to shrink.

Molybdenum (Mo) metallization is an alternative metallization option. During Mo metallization, a liner layer is deposited, followed by a bulk Mo layer. During deposition of the bulk Mo layer, process conditions can be controlled to nearly completely convert the liner layer to elemental Mo, thereby allowing more of the space in a feature to be filled with elemental Mo, which has lower resistivity than the combination of a non-converted liner layer and bulk Mo. Overall, this results in elemental Mo being in contact with the gate oxide.

One function of a 3D NAND device is the ability to retain data in the device. One advantage of using a 3D NAND device is its nonvolatility. Data may be written to a transistor in a 3D NAND device and then left unpowered for a period of time; when the 3D NAND device is later powered, the data is expected to still be written to the transistor to thereby function as an effective 3D NAND device. The ability of the transistor to retain that data after the period of time has lapsed may be referred to as data retention—e.g., whether the data can effectively be retained in the device.

Data retention in 3D NAND devices that use Mo as the memory cell transistors' gate metal has not been as effective as W-based 3D NAND devices when the liner layer is completely converted to elemental Mo. While overall resistivity of the stack may be lower, data retention may not be as effective.

Without being bound by a particular theory, it is believed that oxygen, and other non-molybdenum component elements (such as aluminum), are stripped from the gate oxide stack during deposition of the gate metal, resulting in vacancy defects, leading to higher leakage of the nonvolatile trapped charge. This trapped charge leakage causes reduced data retention: the data is lost more quickly. Without being bound by a particular theory, it is believed that quantum tunneling caused by defects in the dielectric film in the gate oxide stack at the dielectric-metal interface contribute to increased data loss. For example, if defects in the dielectric film are near an electron, the electron can overcome an energy barrier and leave the dielectric. The more defects there are in the dielectric film, the more likely electrons originally trapped in the trapping layer of the dielectric are likely to leave the dielectric, resulting in data loss at a faster rate. It is believed that oxygen in the stack are being removed from the stack and causing formation of defects that allow quantum tunneling, thereby contributing to increased data loss.

One potential way to reduce the oxygen and non-molybdenum component element loss is to supply an overabundance of oxygen and non-molybdenum component elements in the initial gate metal film, or to fabricate the metal-dielectric interface to have a composition similar to TiN W integration schemes that have been used in gate oxide stacks. This may reduce the driving force that leads to loss of oxygen and other non-molybdenum component elements from the gate oxide stack. It is also believed that retaining oxygen or other elements in the nucleation layer can prevent oxygen and other elements from being removed from the dielectric. For example, when the metal layer is deposited on the nucleation layer, it is believed that the process conditions for depositing the metal layer cause an interaction between the nucleation layer and dielectric layer such that oxygen is removed from the dielectric layer, whereas when the nucleation layer retains some oxygen or other non-molybdenum component element impurities, the rate of data loss is substantially reduced.

Memory device electrical performance has also changed due to changing of wordline metals from W to Mo. Previously, tungsten integration involved a barrier metal such as TiN, tungsten nitride (WN), tungsten carbonitride (WCN), and the like. Deposition of TiN barrier layers resulted in exposure to various chemistries, including ammonia ($NH_3$), chlorine ($Cl_2$), and hydrochloric acid (HCl) at high temperatures, but the overall process scheme adapted to these exposures such that trace amounts of these elements did not intrinsically harm the control gate or capacitor dielectrics. Deposition of tungsten layers resulted in exposure of control gate and capacitor dielectrics to a variety of other chemistries, including diborane ($B_2H_6$), silane ($SiH_4$), hydrogen ($H_2$), tungsten hexafluoride ($WF_6$) and reaction byproducts including but not limited to fluorine ($F_2$), hydrofluoric acid (HF), boron trifluoride ($BF_3$), silicon tetrafluoride ($SiF_4$) and others. However, process schemes were developed such that these exposures did not intrinsically harm the control gate or capacitor dielectrics.

Semiconductor fabrication processes have previously been performed in consideration of using TiN barrier layers and/or tungsten-containing film deposition, particularly deposition using $WF_6$ and $B_2H_6$ gas. Barrier metal layers may be TiN layers deposited using a nitrogen-containing reactant such as $NH_3$ and titanium-containing reactant such as titanium tetrachloride ($TiCl_4$), and $H_2$. Such deposition can result in incorporation of trace amounts of fluorine, boron, and other non-molybdenum component elements in the device. Some devices may perform more optimally with these trace amounts still in the device, even when metallization involves deposition of Mo instead of W. However, while some Mo deposition may include barrier layers, some integration schemes may be integrated without barrier layers.

Without being bound by a particular theory, it is believed that the presence of trace amounts of non-molybdenum component elements at the dielectric-metal interface of a metallization stack may contribute to improved device performance where the metal used for metallization is Mo. While Mo deposition may involve exposure to $NH_3$, $H_2$, and HCl, process schemes with W deposition also involved such exposures so these gases may not necessarily be intrinsically harmful to the dielectric. However, deposition of Mo also includes exposure to Mo-containing precursors, reaction byproducts such as water ($H_2O$) and nitric oxide (NO), and Mo oxides and suboxides, as well as molybdenum oxynitride ($MoO_xN_y$). Process schemes with W deposition do not typically involve exposures to these gases that are used in Mo deposition. To mitigate potential detrimental effects of such exposures, compounds that dielectrics were exposed to during W deposition can be used to modulate the dielectric-Mo interface resulting in good electrical performance for Mo gate oxide stacks.

Certain disclosed embodiments address these issues in various applications, including but not limited to 3D NAND fabrication of wordlines with a barrier metal, 3D NAND fabrication of wordlines without a barrier metal, DRAM buried wordline with a barrier metal, DRAM buried wordline without a barrier metal, and metal-oxide-semiconductor capacitor (MOSCAP) devices.

While dielectric-Mo interfaces are described herein as an example, it will be understood that various disclosed embodiments are also suitable for modulating other dielectric-metal interfaces. Non-limiting example metal-dielectric interfaces include aluminum oxide-molybdenum ($Al_2O_3$—Mo) interfaces, silicon oxide-molybdenum ($SiO_2$—Mo) interfaces, zirconium oxide-molybdenum ($ZrO_2$—Mo) interfaces, and other control gate dielectrics interfaced with metals such as Mo.

Provided herein are methods of forming metallization stacks of Mo that incorporate trace amounts of non-molybdenum component elements during formation of the metallization stack. Such methods may be specifically targeted for modifying the dielectric-metal interface. Methods may be performed during any operation of depositing metal, including but not limited to before deposition of any metal, before deposition of a metal nucleation layer such as metal oxynitride, after deposition of some metal (including metal oxynitride and bulk metal), after deposition of some of a metal nucleation layer, after deposition of the entire metal nucleation layer and before deposition of bulk metal, throughout or during deposition of the metal nucleation layer, throughout or during deposition of the bulk metal, or after deposition of the bulk metal. Where embodiments involve a substrate having a barrier layer on the dielectric, methods described herein may be performed on the dielectric before depositing the barrier layer, after depositing the barrier layer, or during deposition of the barrier layer. Methods described herein may incorporate one or more of the following elements: oxygen, nitrogen, fluorine, boron, chlorine, and tungsten. In various embodiments, 3D NAND gate transistors are fabricated using certain disclosed embodiments. Various disclosed embodiments involve plasma-free deposition or plasma-less deposition. Various disclosed embodiments are thermal processes.

Certain disclosed embodiments retain impurity content of boron, fluorine, oxygen, nitrogen, chlorine, and other non-molybdenum component elements that may range between less than about 1 atomic % and about 50 atomic % per element type. In various embodiments, a gradient composition may be formed whereby impurity content near the dielectric-metal interface is greater than in the bulk metal. The high impurity content may be between less than about 1 atomic % and about 50 atomic % in the less than about 1 Å to 30 Å range of Mo-containing material at the dielectric-Mo interface.

In some embodiments, methods involve one or more of the following operations: temperature and/or gas treatment of the substrate (including the dielectric, partial or full barrier layer, partial or full metal nucleation layer, or partial or full metal layer) using particular gases; and deposition whereby at least one of deposition of the initial Mo layers, treatment of the interface between an liner layer and bulk Mo layer, and deposition of bulk Mo layer is modified to increase or retain content of oxygen and other elements in the liner layer. For example, deposition of the liner layer may include under-reacting the Mo precursor to retain oxygen in the metal film. Methods described herein are particularly advantageous for implementation in a multi-station apparatus for fabricating semiconductor devices, such as a quad-station module available from Lam Research Corporation of Fremont, CA. The quad-station module includes four stations; at least one station may be used to deposit molybdenum in accordance with certain disclosed embodiments. In one example, one station can be for depositing a liner, another for depositing an optional initiation layer, another for depositing the bulk, and another for depositing an overburden to ensure complete fill of the feature. In some embodiments, the quad-station module allows depositing a liner and depositing a bulk in two separate stations. The station for depositing the liner and/or the bulk can be modulated to reduce deposition temperature (or modulate or perform any other process condition described herein for certain disclosed embodiments) while allowing other stations to deposit at higher deposition temperatures or other process conditions that improve reaction rate to allow higher module throughput.

Figure 1B:
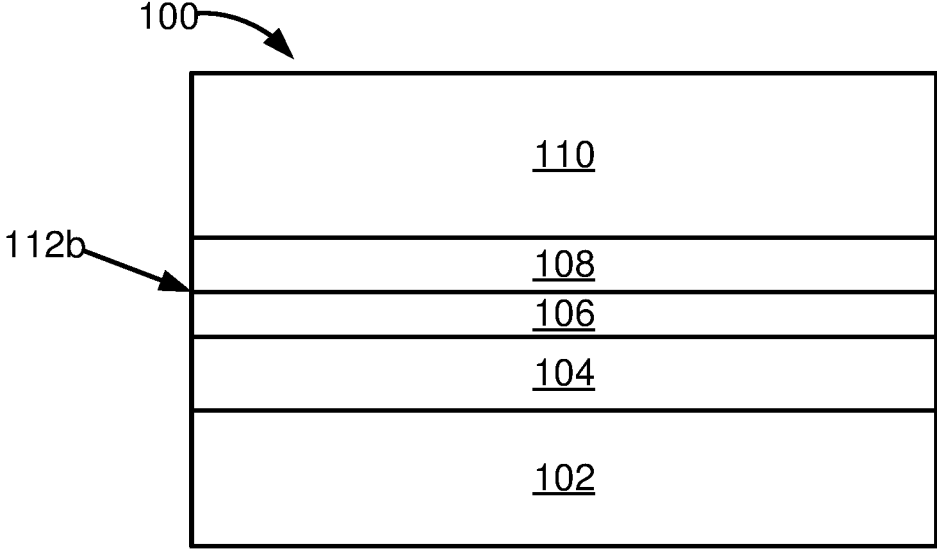

FIGS. 1A and 1B are schematic examples of material stacks that include a nucleation layer as a template for metal growth. FIGS. 1A and 1B illustrate the order of materials in a particular stack and may be used with any appropriate architecture and application, as described further below with respect to FIGS. 3 and 4. In the example of FIG. 1A, stack 100 includes a substrate 102 which may be a silicon or other semiconductor wafer, e.g., a 200-mm wafer, a 300-mm wafer, or a 450-mm wafer, including wafers having one or more layers of material, such as dielectric, conducting, or semi-conducting material deposited thereon. The methods may also be applied to form metallization stack structures on other substrates, such as glass, plastic, and the like. In some embodiments, the substrate 102 includes silicon.

A dielectric layer 104 is on the substrate 102. The dielectric layer 104 may be deposited directly on a semiconductor surface of the substrate 102, or there may be any number of intervening layers. Examples of dielectric layers include doped and undoped silicon oxide ($SiO_2$), doped and undoped silicon carbide (SiC), silicon nitride (SiN), and aluminum oxide ($Al_2O_3$) layers, with specific examples including doped or undoped layers silicon oxide ($SiO_2$) and $Al_2O_3$. Also, in another embodiment, in FIG. 1B, a stack 100 includes a barrier layer 106 deposited between the nucleation layer 108 and the dielectric layer 104. The barrier layer 106 may be a diffusion barrier, an adhesion barrier, or both. Examples of barrier layers including TiN, Ti/TiN, WN, and WCN. In various embodiments, the barrier layer 106 is between about 10 Å and about 40 Å in thickness or between about 10 Å and about 20 Å in thickness. In FIG. 1A, nucleation layer 108 is deposited on dielectric layer 104 and a metal layer 110 is deposited on nucleation layer 108. In FIG. 1B, nucleation layer 108 is deposited on barrier layer 106 and a metal layer 110 is deposited on nucleation layer 108. FIGS. 1A and 1B show dielectric-metal interface, i.e., 112a and 112b. Certain disclosed embodiments may involve performing a treatment operation before depositing nucleation layer 108, performing a treatment operation after depositing at least some of nucleation layer 108, performing a treatment operation after depositing all of the nucleation layer 108, modulating deposition conditions of the nucleation layer 108, performing a treatment operation before depositing metal layer 110, performing a treatment during deposition of metal layer 110, modulating deposition conditions when depositing at least some of metal layer 110, modulating deposition conditions when depositing all of metal layer 110, or combinations thereof. Metal layer 110 can be formed such that it is in contact at dielectric-metal interface 112 with the nucleation layer 108.

The metal layer 110 deposited on the nucleation layer 108 is the main conductor (also referred to as a bulk conductor or bulk layer) of the structure with the nucleation layer 108 providing a template for metal growth.

As described further below, the nucleation layer 108 may be deposited as an amorphous film. An amorphous film has no grain structure and as a template for metal growth, low resistivity metal having no grain structure and/or large grains (as opposed to small grains) can be formed. Examples of metal layers include Mo layers.

In the examples of FIGS. 1A and 1B, the nucleation layer 108 deposited is a metal oxynitride layer, such as a $MoO_xN_y$ layer.

In certain disclosed embodiments, during subsequent processing, in certain embodiments, some of the nucleation layer 108 may be converted to a pure metal while some of the nucleation layer 108, such as a region at the interface of nucleation layer 108 and dielectric layer 104, may retain non-molybdenum component element impurities such as boron, fluorine, tungsten, oxygen, nitrogen, and chlorine, and some of nucleation layer 108 may not be converted to a pure metal. A pure metal may be defined as having a non-molybdenum component element composition of less than about 1%.

Non-molybdenum component element impurities are intentionally maintained within the nucleation layer 108 at or near the dielectric-metal interface which can reduce the chances of oxide diffusion from the dielectric that can cause data loss. Accordingly, according to various embodiments, the nucleation layer 108 may or may not be the same composition as the metal layer 110. In some embodiments, the nucleation layer 108 includes multiple layers, or is a gradient layer, or is a layer deposited by repeating at least one ALD cycle with the same precursor and reactant flows in each cycle, and when depositing the metal layer 110, the nucleation layer 108 is modified to result in a gradient, in multiple layers, in a change in morphology, or in the change in the impurity composition of the nucleation layer. In some embodiments, one or more of the multiple layers are gradient layers. In some embodiments, the nucleation layer 108 may be characterized by its amorphous character, with the metal layer 110 characterized by its lack of grain boundaries.

In some embodiments, the metal of the metal oxynitride layer is the same as that of the pure metal conductor, e.g., a $MoO_xN_y$ layer may be deposited as a nucleation layer prior to deposition of a Mo layer. In other embodiments, the metal oxynitride layer may have a different metal than that of the pure conductor, e.g., a W layer may be deposited on a Mo-containing nucleation layer or a Mo layer may be deposited on a W-containing nucleation layer.

While FIGS. 1A and 1B show examples of metallization stacks, the methods and resulting stacks are not so limited. For example, in some embodiments, the nucleation layer may be deposited directly on $SiO_2$, silicon, or other semiconductor substrate as a template for metal growth. Further, while W or Mo growth on the nucleation layers is described above, the nucleation layers may serve as a template for low resistivity growth of other metals, such as, cobalt (Co), ruthenium (Ru), nickel (Ni), and alloys including these metals such as MoW. Still further, the nucleation layer may be any appropriate metal oxynitride or metal nitride layer, including $MoO_xN_y$, Mo nitride, tungsten oxynitride, WN, nickel nitride, etc.

Figure 2A:
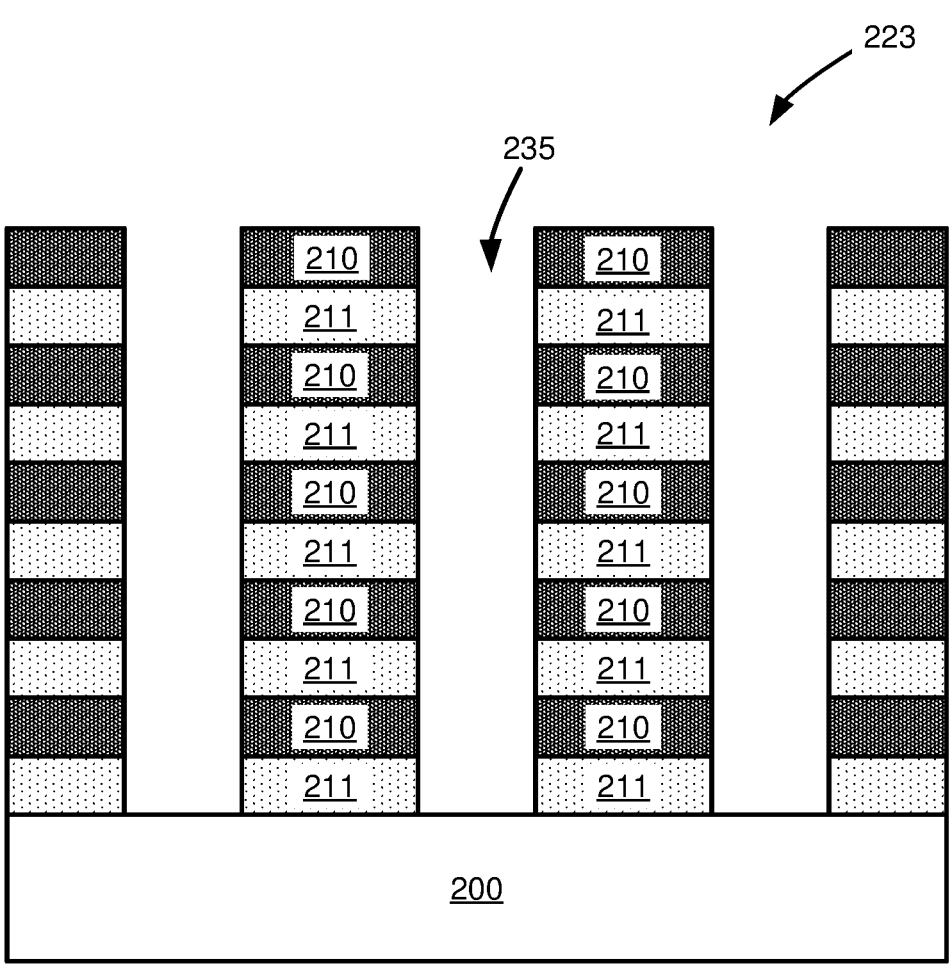
FIGS. 2A and 2B provide examples of structures in which the material stacks may be employed according to various embodiments.
Figure 2B:
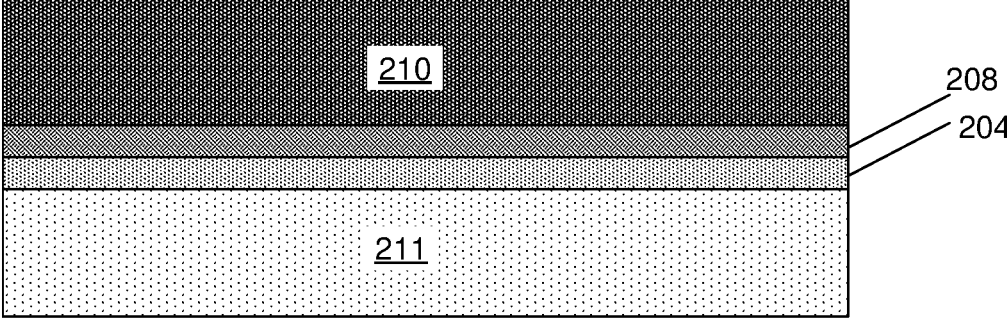

The material stacks described above and further below may be implemented in a variety of structures. FIGS. 2A and 2B provide examples of structures in which the stacks may be employed. FIG. 2A depicts a schematic example of wordlines 210 in a 2D NAND structure 223. The wordlines 210 are separated by oxide layers 211 as pillars with gaps 235 between them on substrate 200. In FIG. 2B, a detail of the interface between a wordline 210 and oxide layer 211 is shown including a layer of $Al_2O_3$ 204 and a nucleation layer 208 is shown. In some embodiments, the nucleation layer 208 may be deposited directly on the oxide layer 211 or on a TiN the layer of $Al_2O_3$ 204 or other barrier layer as described herein. The nucleation layers may be between about 10 Å and 100 Å, or 10 Å and 50 Å, for example, for deposition of a wordline 210 of between about 10 nm and 100 nm thick, or about 5 nm thick or less.

Figure 3A:
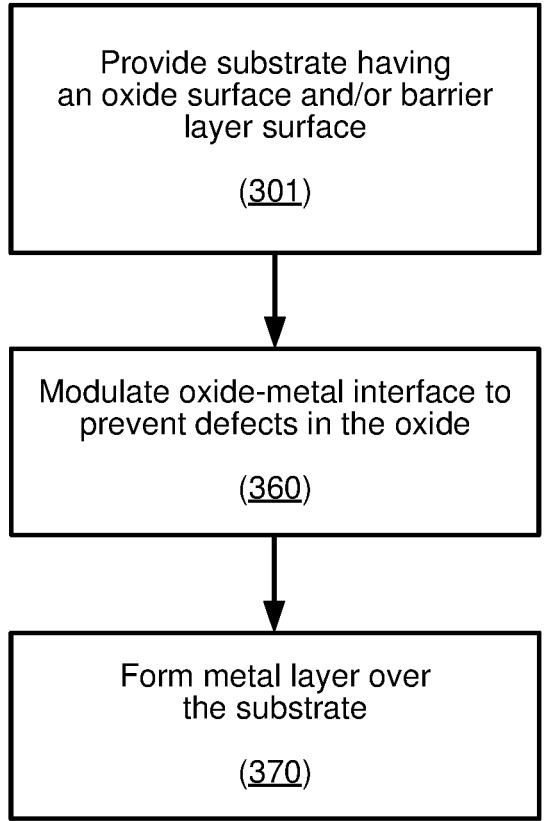
FIGS. 3A, 3B, and 3C are process flow diagrams illustrating operations in methods of depositing a conductive material according to various embodiments.

FIG. 3A is a process flow diagram illustrating operations in a method of depositing a conductive material in accordance with certain disclosed embodiments. In operation 301, a substrate having an oxide surface and/or a barrier layer surface (which may be on an oxide surface) is provided. Examples of process conditions and features of operation 301 are provided further below with respect to FIG. 3B. In operation 360, the oxide-metal interface is modulated to prevent defects in the oxide. Example methods for performing operation 360 are described below with respect to FIGS. 3B and 3C. In operation 370, a metal layer is formed over the substrate whereby the metal is in contact with the oxide surface or barrier layer surface. Example embodiments for performing operation 370 are further described below with respect to FIGS. 3B and 3C.

In FIG. 3A, operations 360 and 370 may be performed at the same time; or in order of operation 360 first followed by operation 370; or operation 370 first followed by operation 360; or a combination of operations 360 and 370 may be performed together (such as alternately; or some operations of operation 360 performed during operation 370; or some operations of operation 370 performed during operation 360. Each of operations 301, 360, and 370 may be performed in the same chamber, in a single chamber, in one or more stations of the same chamber, or in one or more stations of different chambers.

Figure 3B:
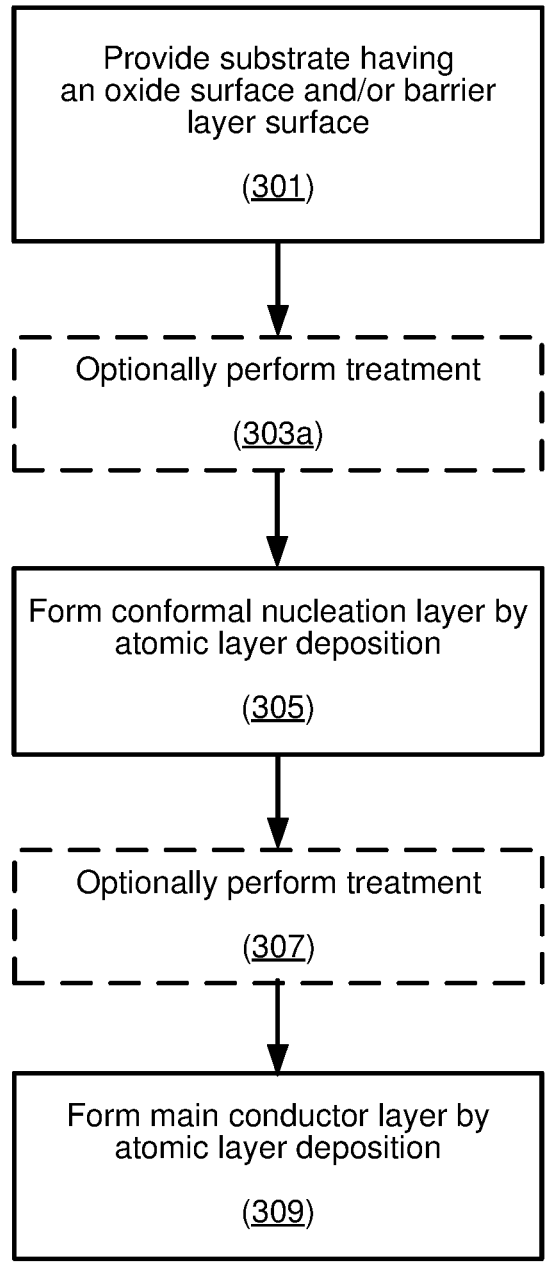

FIG. 3B is a process flow diagram illustrating operations in a method of depositing a conductive material. It will be understood that each of operations 301, 303a, 305, 307, and 309 may be each performed in the same chamber as when performing one of the other operations in FIG. 3B or may be performed in separate chambers or may be performed using a combination of same and different chambers, and that each of operations 301, 303a, 305, 307, and 309 may be each performed in the same station in a multi-station chamber as when performing one of the other operations in FIG. 3B or may be performed in separate stations or may be performed using a combination of same and different stations.

At least one of the operations in FIG. 3B identified as an optional operation is performed. Each of the optional operations may be used in combination with other optional operations in FIG. 3B; for example, treatment in operation 303a may be performed while omitting modulating process conditions in operations 305 and 309 and omitting the treatment in operation 307.

In operation 301, a substrate having an oxide surface is provided. This may be the same as operation 301 in FIG. 3A. In various embodiments, the substrate has a dielectric layer including an oxide surface thereon. In various embodiments, the substrate is provided in a first process station of a multi-station chamber. The substrate may be a silicon wafer, e.g., a 200-mm wafer, a 300-mm wafer, or a 450-mm wafer, including wafers having one or more layers of material, such as dielectric, conducting, or semi-conducting material deposited thereon. Non-limiting examples of under-layers include dielectric layers and conducting layers, e.g., silicon oxides, silicon nitrides, silicon carbides, metal oxides, metal nitrides, metal carbides, and metal layers. In some embodiments, the substrate is the same as substrate 102 in FIG. 1A or 1B.

The substrate includes an oxide surface. In some embodiments, the oxide surface is a part of a dielectric layer, such as dielectric layer 104 in FIG. 1A. In some embodiments, the oxide surface is part of a barrier layer, such as barrier layer 106 in FIG. 1B. In some embodiments, the oxide surface includes silicon oxide. In some embodiments, the oxide surface includes aluminum oxide.

Returning to FIG. 3, in operation 303a an optional soak treatment is performed. The optional soak treatment may be performed to prepare the surface of the oxide surface on the substrate prior to operation 305. Soaking may cause deposition of material in operation 305 to deposit differently or form a different composition on the surface of the oxide.

In various embodiments, operation 303a involves introducing a boron-containing gas, such as diborane ($B_2H_6$). Exposure to a boron-containing gas can make the dielectric process history more similar to previous process histories that involved TiN with tungsten integration.

In various embodiments, operation 303a involves introducing a tungsten-containing or fluorine-containing gas, such as tungsten halides, including but not limited to tungsten hexachloride, tungsten pentachloride, tungsten pentafluoride, and tungsten hexafluoride ($WF_6$). Fluorine exposure can make the dielectric process history more similar to the process history with TiN with tungsten integration. However, exposure may be limited so as not to expose dielectric to too much fluorine, which can be detrimental to device performance, but trace exposure can be advantageous to match the device performance of TiN with W integration.

In various embodiments, operation 303a is performed with two or more temporally separated pulses of gas treatments. For example, exposure may alternate between $B_2H_6$ and $WF_6$ in some embodiments, such as one may do to perform deposition of a W nucleation layer by atomic layer deposition. This operation may be performed to make the dielectric process history more similar to the process history of TiN with W integration. Any W nucleation layer that may be deposited by performing operation 303a is minimized (e.g., very few cycles, such as between 1 and 5 or 1 and 10 cycles are used) to avoid negative impact of Mo or subsequent metal conductor layer resistivity. Ultra-thin W nucleation layer deposited by ALD prior to Mo deposition may reduce Mo resistivity if it provides a template for large-grain or amorphous Mo growth in various embodiments. In various embodiments, boron-containing and W-containing or fluorine-containing gas exposures are performed simultaneously, similar to a chemical vapor deposition (CVD) type process. A combination of ALD and CVD processes may be used.

Operation 303a may be performed as a separate operation before operation 305 or may be performed during operation 305 such as after some nucleation layer is deposited whereby operation 303a and operation 305 may be performed in temporally alternating operations. In some embodiments, operation 303a is performed periodically throughout other operations performed in FIG. 3.

In some embodiments, the soak treatment includes exposing the oxide surface to one or more gases such as oxygen-containing gas, nitrogen-containing gas, or other suitable gas that is capable of changing the interface between the oxide surface and the later deposited material to reduce tunneling of electrons from the oxide in the substrate out of the oxide, and combinations thereof. Example oxygen-containing gases include oxygen gas. Example nitrogen-containing gases include $NH_3$ gas and nitrogen.

Operation 303a may be performed at any suitable temperature. Example non-limiting temperatures include up to about 650° C., or less than about 350° C., or between about 250° C. and about 350° C. Non-limiting examples of chamber pressure may be up to about 90 Torr, or between about 5 Torr and about 50 Torr, or between about 5 Torr and about 15 Torr, or about 10 Torr.

Exposure times may vary depending on flow rates. Non-limiting examples of exposure times range from about 0.1 second to about 10 seconds, or between about 0.1 second and about 20 seconds for each gas. For alternating pulses of treatments, each pulse may have any of the above exposure times. Overall duration of operation 303a may range from about 0.1 second to about 20 seconds, or between about 0.1 second to about 15 seconds, or between about 0.1 second to about 10 seconds.

Exposure times for $B_2H_6$ and hydrogen gas exposure may be between about 0.1 second and about 10 seconds. For example, in some embodiments, $B_2H_6$ and hydrogen may be simultaneously flowed to the substrate for between about 0.1 second and about 10 seconds.

Exposure times for $WF_6$ gas exposure may be between about 0.1 second and about 1 second. For example, in some embodiments, $WF_6$ may be flowed to the substrate for between about 0.1 second and about 1 second.

Where alternating pulses are performed, a purge operation may be performed between alternating pulses. Purging may involve flowing argon gas or another inert gas for a particular duration, such as between about 0.1 second and about 1 second.

In one example of an embodiment where alternating pulses are performed in operation 303a, one cycle of pulses may involve: (1) $B_2H_6$ and hydrogen dose for between 0.1 second and 10 seconds, (2) purge using argon gas for between 0.1 second and 1 second, (3) $WF_6$ dose between 0.1 second and 1 second, and (4) purge using argon gas for between 0.1 second and 1 second.

The gas flow of the one or more gases depends on chemistry of one or more gases selected, the oxide surface material, the duration of exposure, the mixture of gases if more than one gas is flowed, and the extent of the soak effect desired for the given substrate. Duration of gas exposure depends on the gas flow, type of gas, and extent of soak effect desired.

Non-limiting example gas flows for flowing oxygen gas may vary between about 100 sccm and about 10,000 sccm. Example durations for oxygen gas flows include between about 0.1 second and about 30 seconds.

Non-limiting example gas flows for flowing $NH_3$ gas may vary between about 100 sccm and about 10,0000 sccm. Example durations for $NH_3$ gas flows include between about 0.1 second and about 30 seconds.

Non-limiting example gas flows for flowing nitrogen gas may vary between about 100 sccm and about 10,000 sccm. Example durations for nitrogen gas flows include between about 0.1 second and about 30 seconds.

In operation 305, a conformal nucleation layer is formed by atomic layer deposition (ALD) on the substrate. In various embodiments the conformal nucleation layer is deposited on the oxide surface of the substrate provided in operation 301. In some embodiments, operation 303a and operation 305 are performed in the same chamber, or in the same tool in separate chambers, or without breaking vacuum. In some embodiments, an air break occurs after operation 303a before operation 305, which may be advantageous as after operation 303a, exposed boron or fluorine atoms may be on the surface and those atoms may oxidize thereby incorporating oxygen into the device before operation 305, which can enable reduced resistivity of the overall film stack and/or reduce data loss as incorporated non-molybdenum component elements can help reduce the likelihood of oxide loss or diffusion.

During operation 305, process conditions may be modulated to modify the composition of the conformal nucleation layer. For example, process conditions may be adjusted to increase non-molybdenum component element content of the conformal nucleation layer, such as the oxygen, chlorine, and/or nitrogen content. It will be understood that in some embodiments, if optional soak treatments are performed in operations 303a or 307 and/or if process conditions are modulated in operation 309, process conditions may not be modulated in operation 305. Likewise, it is also possible to modulate process conditions in operation 305 while also performing at least one of the soak treatments of operations 303a and 307 as well as modulating process conditions in operation 309 or any combination herein.

In an ALD process, the substrate may be exposed in cycles such that the substrate is first exposed to a pulse of a suitable metal-containing precursor, then the precursor is optionally purged, then the substrate is exposed to a pulse of a reducing agent, and then the reducing agent is optionally purged, and such cycles may be repeated until a desired thickness of the nucleation layer is formed on the substrate. It will be appreciated that the order of precursor and reducing agent may be reversed such that the sequence may be initiated by a reducing agent dose followed by a metal containing precursor dose. Purging may be performed by flowing an inert gas, such as argon. In some embodiments, inert gases may also be used as a carrier gas to deliver one or more gases, including but not limited to soak gases, precursor gases, and reactant gases, to the substrate.

ALD is a technique that deposits thin layers of material using sequential self-limiting reactions. Typically, an ALD cycle includes operations to deliver and adsorb at least one reactant to the substrate surface, and then react the adsorbed reactant with one or more reactants to form the partial layer of film. As an example, a $MoO_xN_y$ deposition cycle may include the following operations: (i) delivery/adsorption of a Mo-containing precursor, (ii) purging of the Mo precursor from the chamber, (iii) delivery of an nitrogen-containing reactant or nitrogen-containing gas, and (iv) purging of the nitrogen-containing reactant from the chamber.

Unlike a chemical vapor deposition (CVD) technique, ALD processes use surface-mediated deposition reactions to deposit films on a layer-by-layer basis. In one example of an ALD process, a substrate surface that includes a population of surface active sites is exposed to a gas phase distribution of a first precursor, such as a Mo-containing precursor, in a dose provided to a chamber housing a substrate. Molecules of this first precursor are adsorbed onto the substrate surface, including chemisorbed species and/or physisorbed molecules of the first precursor. It should be understood that when the compound is adsorbed onto the substrate surface as described herein, the adsorbed layer may include the compound as well as derivatives of the compound. For example, an adsorbed layer of a Mo-containing precursor may include the Mo-containing precursor as well as derivatives of the Mo-containing precursor. After a first precursor dose, the chamber is then evacuated to remove most or all of first precursor remaining in gas phase so that mostly or only the adsorbed species remain. In some implementations, the chamber may not be fully evacuated. For example, the chamber may be evacuated such that the partial pressure of the first precursor in gas phase is sufficiently low to mitigate a reaction. A second reactant, such as an nitrogen-containing reactant, is introduced to the chamber so that some of these molecules react with the first precursor adsorbed on the surface. In some processes, the second reactant reacts immediately with the adsorbed first precursor. The chamber may then be evacuated again to remove unbound second reactant molecules. As described above, in some embodiments the chamber may not be completely evacuated. Additional ALD cycles may be used to build film thickness.

In certain embodiments, an ALD first precursor dose partially saturates the substrate surface. In some embodiments, the dose phase of an ALD cycle concludes before the precursor contacts the substrate to evenly saturate the surface. Typically, the precursor flow is turned off or diverted at this point, and only purge gas flows. By operating in this sub-saturation regime, the ALD process reduces the cycle time and increases throughput. However, because precursor adsorption is not saturation limited, the adsorbed precursor concentration may vary slightly across the substrate surface. Examples of ALD processes operating in the sub-saturation regime are provided in U.S. patent application Ser. No. 14/061,587 (now U.S. Pat. No. 9,355,839), filed Oct. 23, 2013, titled "SUB-SATURATED ATOMIC LAYER DEPOSITION AND CONFORMAL FILM DEPOSITION," which is incorporated herein by reference in its entirety.

While ALD is described herein as an example, it will be understood that films deposited by ALD herein may also be deposited by CVD or other techniques.

Substrate temperature for nucleation layer deposition may range, for example, from 250° C. to about 600° C., or from 300° C. to 600° C., or from 250° C. to about 550° C. In some embodiments, lower temperatures may be used. Such temperatures may be less than 500° C., less than 550° C., less than 450° C., less than 400° C., or less than 350° C. Low temperatures may be used for improved step coverage. In addition, low temperatures may increase the amount of impurities in the nucleation layer, increasing the amorphous character, which in turn may increase grain size of the subsequently deposited conductor. In various embodiments, it may be advantageous to deposit the nucleation layer at low temperatures. Chamber pressure may be between about 5 Torr and about 90 Torr, or between about 5 Torr and about 50 Torr, or between about 20 Torr and about 40 Torr, or about 30 Torr.

The surface on which the nucleation layer is deposited depends on the particular application. In some embodiments, the nucleation layer is deposited directly on a dielectric (e.g., silicon oxide, aluminum oxide, silicon nitride, etc.) surface. In some embodiments, the nucleation layer is deposited on a barrier layer. In some embodiments, the nucleation layer is deposited before depositing any other metal on the surface. In some embodiments, the nucleation layer is deposited on a treated dielectric. In some embodiments, the nucleation layer is deposited on a tungsten nucleation layer. In some embodiments, the nucleation layer is deposited on an untreated dielectric. In some embodiments, the nucleation layer is deposited on a treated barrier layer. In some embodiments, the nucleation layer is deposited on an untreated barrier layer. In some embodiments, the nucleation layer is deposited directly on a TiN or other surface. In some embodiments, the subsequent elemental metal deposition may be performed on any surface.

In various embodiments, the ALD process in operation 305 involves flowing an oxygen-containing Mo precursor and a reducing agent in sequentially alternating pulses or doses. In some embodiments, the reducing agent is ammonia ($NH_3$) or other nitrogen-containing gas or nitrogen-containing reducing agent such hydrazine ($N_2H_4$). Ammonia chemisorption on dielectrics is more favorable than that of hydrogen ($H_2$) for the nucleation layer. In some embodiments, the reducing agent and precursor are selected such that they react without reducing agent dissociation. Ammonia reacts with metal oxychlorides and metal chlorides without dissociation. This is in contrast to, for example, ALD from metal oxychlorides that uses hydrogen as a reducing agent; hydrogen dissociates on the surface to form adsorbed atomic hydrogen, which results in very low concentrations of reactive species and low surface coverage during initial nucleation of metal on the dielectric surface. By using $NH_3$ and metal oxychloride or metal chloride precursors, nucleation delay is reduced or eliminated at deposition temperatures up to hundreds of degrees lower than used by hydrogen reduction of the same metal precursors.

In some embodiments, the reducing agent may be a boron-containing or silicon-containing reducing agent such as $B_2H_6$ or $SiH_4$. These reducing agents may be used with metal chloride precursors; with metal oxychlorides, however, the $B_2H_6$ and $SiH_4$ will react with water formed as a byproduct during the ALD process and form solid $B_2O_3$ and $SiO_2$, which are insulating and will remain in the film, increasing resistivity. Use of $NH_3$ also has greater adhesion over $B_2H_6$ and $SiH_4$ ALD processes on certain surfaces including $Al_2O_3$.

Examples of metal oxychloride and metal chloride precursors include molybdenum pentachloride ($MoCl_5$), molybdenum oxychlorides such as molybdenum dichloride dioxide ($MoO_2Cl_2$) and molybdenum oxytetrachloride ($MoOCl_4$), tungsten pentachloride ($WCl_5$), tungsten hexachloride ($WCl_6$), tungsten tetrachloride ($WCl_4$), tungsten dichloride ($WCl_2$), and tungsten oxychlorides ($WO_xCl_y$) such as tungsten oxytetrachloride ($WOCl_4$).

The metal chloride and metal oxychloride may be useful in embodiments in which fluorine incorporation is a concern. However, in some embodiments, fluorine-containing precursors such as nitrogen trifluoride ($NF_3$) may be used. These include metal fluorides such as $WF_6$, molybdenum hexafluoride ($MoF_6$), and molybdenum pentafluoride ($MoF_5$).

The resulting nucleation layer is generally not a pure elemental film but a metal nitride or metal oxynitride film. In some embodiments, there may be residual chlorine or fluorine from the deposition, particularly if the deposition is performed at low temperatures. In some embodiments, there is no more than a trace amount of residual chlorine or fluorine. In some embodiments, the nucleation layer is an amorphous layer. Impurities in the film (e.g., oxygen, $NH_3$, chlorine, or other halogen) facilitate growth of an amorphous microstructure. In some embodiments, the nucleation layer as deposited is an amorphous metal oxynitride layer or an amorphous metal nitride layer. The amorphous character templates large grain growth in the subsequently deposited conductor. The surface energy of nitride or oxynitride relative to an oxide surface is much more favorable than that of a metal on an oxide surface, facilitating formation of a continuous and smooth film on the dielectric. This allows formation of thin, continuous layers. Example thicknesses of the nucleation layer range from 5 Å-30 Å as deposited. Depending on the temperature, this may be about 5-50 ALD cycles for example.

During operation 305, deposition process conditions are optionally modulated to increase or modulate the amount of non-molybdenum component elements or "impurities" in the film. One technique is to vary exposure times and/or exposure flows during the deposition process. For example, in an ALD method, the substrate is exposed first to a pulse of a suitable metal-containing precursor, followed by exposure to a pulse of a reducing agent. In various embodiments, the flow of the reducing agent is modified to retain more impurities from the metal-containing precursor in the resulting metal oxynitride film. Example flow rates of reducing agent include about 100 sccm to about 40,000 sccm. Flow rates are used during reducing agent pulses.

In some embodiments, during at least one of the exposure to the precursor and the exposure to the reducing agent, one or more additive gases are flowed. The additive gases may include oxygen-containing gases, nitrogen-containing gases, or combinations thereof. Example oxygen-containing gases include oxygen. Example nitrogen-containing gases include nitrogen and $NH_3$. Additive gases may be continuously flowed, flowed only with the Mo precursor, flowed only with the reducing agent, flowed only with the purge gas, or periodically without being synchronized to either precursor doses, reducing agent doses, or purge gas operations.

Another technique which may be performed alone or in combination with the above technique is to change the process conditions. For example, temperature or pressure may be modulated to retain oxygen, nitrogen, and other component elements in the metal oxynitride layer. In various embodiments, operation 305 may be performed at a temperature up to about 650° C., or less than about 350° C., or between about 200° C. and about 550° C., or between about 250° C. and about 350° C. to retain impurities in the film. In some embodiments, the chamber pressure can be between about 5 and about 90.

Another technique for retaining impurity content in the nucleation layer is to change the morphology of the film. An amorphous films is more likely to reduce diffusion of impurities out of the film and thus reduce the likelihood of oxygen or other elements from the dielectric from diffusing out of the dielectric, thereby reducing the chances of trapped charge from escaping the dielectric and causing data loss. The morphology may be modulated by reducing the temperature of the substrate during film deposition and bulk molybdenum deposition.

Although certain disclosed embodiments may involve modulating the first few cycles of ALD of operation 305, in some embodiments, most or all cycles of ALD in operation 305 may be modulated. Any combination of modulated ALD cycles may be performed, including alternating between modulated and non-modulated cycles, such as performing a few cycles of low temperature ALD followed by a few cycles of high temperature ALD and repeating this sequentially, to improve throughput.

Exposure times for gases used to deposit the nucleation layer may vary depending on flow rates. Non-limiting examples of exposure times range from about 0.1 seconds to about 10 seconds, or between about 0.1 seconds and about 20 seconds for each gas. For alternating pulses of treatments, each pulse may have any of the above exposure times.

Exposure times for $NH_3$ and hydrogen gas exposure depend on the particular application and can range widely. In some embodiments, hydrogen gas exposure may be at least about 30 seconds or longer. Non-limiting examples of exposure times include between about 0.1 second and about 60 seconds, between about 0.1 second and about 50 seconds, and at least about 30 seconds. For example, in some embodiments, $NH_3$ and hydrogen may be simultaneously flowed to the substrate for at least about 30 seconds, or between about 0.1 second and about 50 seconds.

Exposure times for an oxygen-containing Mo precursor (such as one having a formula $MoO_xCl_y$) gas exposure may be between about 0.1 second and about 10 seconds. For example, in some embodiments, an oxygen-containing Mo precursor may be flowed to the substrate for between about 0.1 second and about 10 seconds.

Where alternating pulses are performed, a purge operation may be performed between alternating pulses. Purging may involve flowing argon gas or an other inert gas for a particular duration, such as between about 0.1 second and about 5 seconds.

In one example of an embodiment where alternating pulses are performed in operation 305, one cycle of pulses may involve: (1) $NH_3$ and hydrogen dose for between 0.1 second and 10 seconds, (2) purge using argon gas for between 0.1 seconds and 5 seconds, (3) $MoO_xCl_y$ dose between 0.1 seconds and 10 seconds, and (4) purge using argon gas for between 0.1 seconds and 5 seconds.

Returning to FIG. 3B, in operation 307, a soak treatment is optionally performed. In some embodiments, this soak is performed in addition to or instead of operation 303 without modulating process conditions in operation 305 or with modulating process conditions in operation 305. In various embodiments, the soak treatment performed can use any one or more of the techniques described above with respect to operation 303$a$.

Operation 307 may be performed as a separate operation after operation 305 or may be performed during operation 305 such as after some nucleation layer is deposited whereby operation 307 and operation 305 may be performed in temporally alternating operations. In some embodiments, operation 307 is performed periodically throughout other operations performed in FIG. 3B. Operation 307 may be performed after depositing some main conductor layer material in operation 309, or before any main conductor layer material is deposited in operation 309.

In operation 309, the main conductor layer is formed. In various embodiments, the main conductor layer is formed by ALD while modulating process conditions. In various embodiments, deposition is performed over, on, or directly on the nucleation layer. The main conductor layer may be referred to as the bulk layer or the metal layer. In various embodiments, the main conductor layer is a Mo layer. In various embodiments, the main conductor layer is an elemental Mo layer. In various embodiments, the amount of impurities in the main conductor layer is less than about 1%.

The main conductor layer is deposited by ALD using alternating pulses of an oxygen-containing metal precursor (such as a metal oxyhalide) and a reducing agent. In some embodiments, the main conductor layer is deposited by ALD using an oxygen-containing Mo precursor and hydrogen as the reducing agent. In some embodiments, a purge gas may be used; any purge gas described above with respect to operation 305 may be used in operation 309.

Any Mo precursor described above with respect to operation 305 may be used in operation 309. The Mo precursor may be a molybdenum oxyhalide. In some embodiments, the molybdenum oxyhalide is a molybdenum oxychloride ($MoO_xCl_y$). Examples of metal oxychloride and metal chloride precursors that may be employed in operations 305 and 309 include molybdenum pentachloride ($MoCl_5$) and molybdenum hexachloride ($MoCl_6$), molybdenum oxychlorides such as molybdenum dichloride dioxide ($MoO_2Cl_2$) and molybdenum oxytetrachloride ($MoOCl_4$), tungsten pentachloride ($WCl_5$), tungsten hexachloride ($WCl_6$), tungsten tetrachloride ($WCl_4$), tungsten dichloride ($WCl_2$), and tungsten oxychlorides ($WO_xCl_y$) such as tungsten oxytetrachloride ($WOCl_4$).

Without being bound by a particular theory, it is believed that during deposition of the main conductor layer, impurities from the nucleation layer are removed. In embodiments where the nucleation layer is deposited using an oxygen-containing and chlorine-containing metal precursor and a nitrogen-containing reactant, the impurities present may include oxygen, chlorine, and nitrogen. It is believed that chlorine is more likely to be removed from the nucleation layer first during deposition of the main conductor layer, such as when a higher temperature is used for deposition. Following chlorine, oxygen and/or nitrogen may be removed thereafter. Without being bound by a particular theory, it is believed that reducing the rate of deposition of the main conductor layer reduces the amount of impurities that leave the nucleation layer.

Modulating process conditions in operation 309 helps retain the impurity content of the nucleation layer deposited in operation 307 so that the nucleation layer does not completely or mostly convert to metal during operation 309. Operation 309 is performed under process conditions such that after operation 309, the resulting nucleation layer composition after operation 309 is a metal to impurity atomic ratio of between about 100:1 and about 1:4, or a Mo to oxygen atomic ratio of between about 100:1 and about 1:4.

Modulating process conditions can be performed in various ways. One way is to perform two or more different sets of ALD cycles such that the first few cycles of deposition do not change the composition of the conductor layer, thereby retaining the impurities incorporated during deposition of the nucleation layer in operation 307. The first few cycles may refer to the first to the tenth or the first to the twentieth cycles of ALD in operation 309. The first few cycles may refer to the cycles sufficient to deposit up to 30% of the feature with main conductor layer material. The conditions during these first few cycles may be modulated to prevent the impurities from escaping the nucleation layer. In the first set of ALD cycles, deposition is performed at a lower temperature to reduce the amount of impurities removed from the nucleation layer. Example temperatures may be less than 500° C., less than 550° C., less than 450° C., less than 400° C., or less than 350° C. The lower temperature may be used to reduce the amount of nucleation layer converted to an elemental film such that the amount of impurities or non-molybdenum component elements within the nucleation layer is maintained or is greater than about 1% or at least greater than 0%. In this operation, the reducing agent may be hydrogen ($H_2$). The temperature may be the same temperature as used in operation 305 in some embodiments. The metal precursor may also be the same or a different precursor than in employed in operation 305. In some embodiments, the same precursor is used, with only the reducing agent changed. According to various embodiments, operation 309 may or may not deposit an appreciable amount of film of the main conductor. After the first few cycles, subsequent sets of ALD cycles may be performed at higher temperatures, such as between about 350° C. and about 700° C. Higher temperatures allow for increased deposition rate of the main conductor layer, particularly Mo, as some Mo precursors may be more efficient and more reactive at higher temperatures.

Another technique is to modulate precursor and reducing agent flows to change the rate of deposition of the main conductor layer. Precursor flows may be increased relative to reducing agent flows such that the reducing agent flow is insufficient to convert adsorbed precursor; reducing agent flows may be reduced while keeping precursor flows constant such that there is insufficient reducing agent to convert adsorbed precursors to metal. When precursor flows are increased, example precursor to reducing agent flow ratios may be between about 1:1000 and about 1:10,000. When hydrogen reducing agent flow is reduced, example reducing agent to precursor flow ratios may be between about 1:10 and about 1:1000.

In some embodiments, a gradient film may be formed using certain disclosed embodiments where the impurity level of the metal-containing film near the dielectric layer or barrier layer is higher while the impurity level decreases in the metal-containing film as the distance from the dielectric layer is increased such that fewer impurities or no impurities are in the last few cycles of metal deposited in the main conductor layer. Gradient films may be deposited by using various different sets of ALD cycles during deposition.

In some embodiments, ALD cycles are modulated by changing chamber pressure instead of or in addition to changing temperature and/or precursor flows and/or reactant flows. For example, chamber pressure may be reduced to slow the deposition rate of the main conductor layer to reduce the conversion of the nucleation layer to elemental metal. Example reduced pressures may be between about 5 and about 20 Torr or at least about 30-80% less than the pressure used for deposition of the nucleation layer.

Exposure times for gases used to deposit the main conductor layer may vary depending on flow rates. Non-limiting examples of exposure times range from about 0.1 second to about 10 seconds, or between about 0.1 second and about 20 seconds for each gas. For alternating pulses of treatments, each pulse may have any of the above exposure times.

Exposure times for hydrogen gas exposure may be between about 0.1 second and about 10 seconds. For example, in some embodiments, hydrogen may be flowed to the substrate for between about 0.1 second and about 10 seconds.

Exposure times for an oxygen-containing Mo precursor (such as one having a formula $MoO_xCl_y$) gas exposure may be between about 0.1 second and about 2 seconds. For example, in some embodiments, an oxygen-containing Mo precursor may be flowed to the substrate for between about 0.1 second and about 2 seconds.

Where alternating pulses are performed, a purge operation may be performed between alternating pulses. Purging may involve flowing argon gas or another inert gas for a particular duration, such as between about 0.1 second and about 5 seconds.

In one example of an embodiment where alternating pulses are performed in operation 309, one cycle of pulses may involve: (1) hydrogen dose for between 0.1 second and 10 seconds, (2) purge using argon gas for between 0.1 second and 5 seconds, (3) $MoO_xCl_y$ dose between 0.1 second and 2 seconds, and (4) purge using argon gas for between 0.1 second and 5 seconds.

Figure 3C:
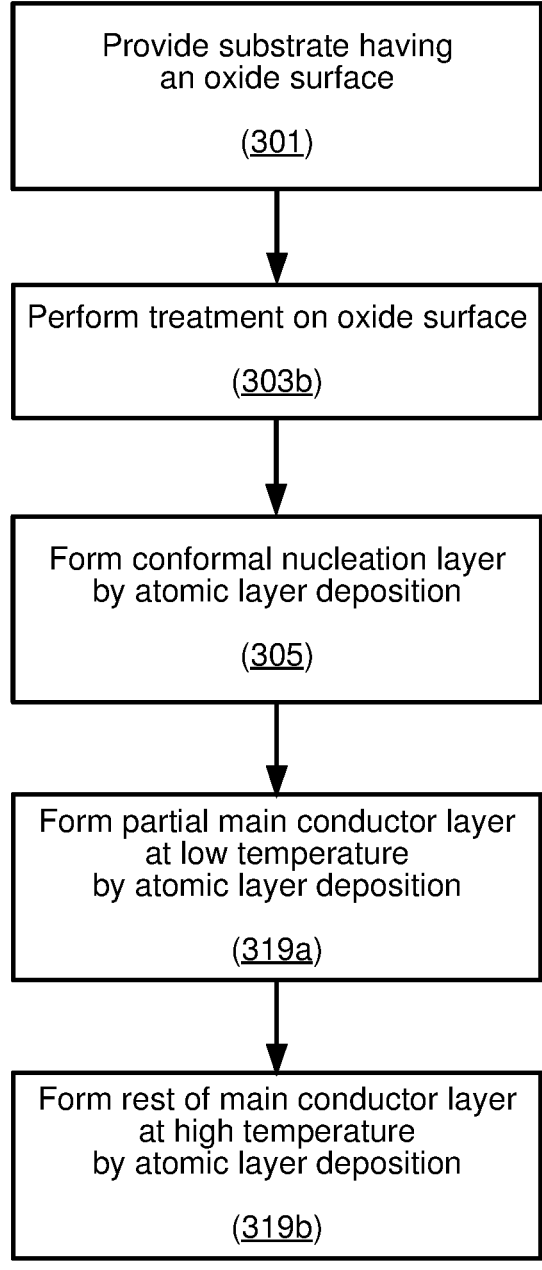

FIG. 3C shows an example process flow diagram for performing certain disclosed embodiments. Operation 301 may be the same as operation 301 in FIGS. 3A and 3B. Operation 303b involves performing treatment on an oxide surface of a semiconductor substrate. This oxide surface may be aluminum oxide or silicon oxide in some embodiments and may be performed using any of the techniques described above with respect to operation 303a. In some embodiments, operation 303b involves exposing the oxide surface to $B_2H_6$ and $WF_6$. In operation 305, a conformal nucleation layer of Mo is deposited by ALD on the treated oxide surface. This may be performed using any of the techniques described with respect to FIG. 3B. In some embodiments, operation 305 involves depositing a $MoO_xN_y$ film by ALD on a $B_2H_6$ and $WF_6$-treated oxide surface. In operation 319a, a partial main conductor layer is deposited at low temperature by ALD. Lower temperature here prevents converting $MoO_xN_y$ deposited in operation 305 from completely converting to Mo metal. Low temperature may be about less than 500° C. In operation 319b, the rest of the main conductor layer is deposited at high temperature by ALD. In some embodiments, operation 319b involves deposited bulk Mo metal by using an oxygen-containing Mo precursor and hydrogen at temperatures greater than 540° C. For exposures performed herein, boron-containing gas doses may result in exposure of between about 1E16 atoms/cm² and about 1E21 atoms/cm² of boron. For exposures performed herein, fluorine-containing gas doses may result in exposure of between about 1E16 atoms/cm² and about 1E21 atoms/cm² of fluorine. For exposures performed herein, W and/or Mo-containing gas doses may result in exposure of between about 1E16 atoms/cm² and about 1E21 atoms/cm² of W or Mo respectively.

Figure 4:
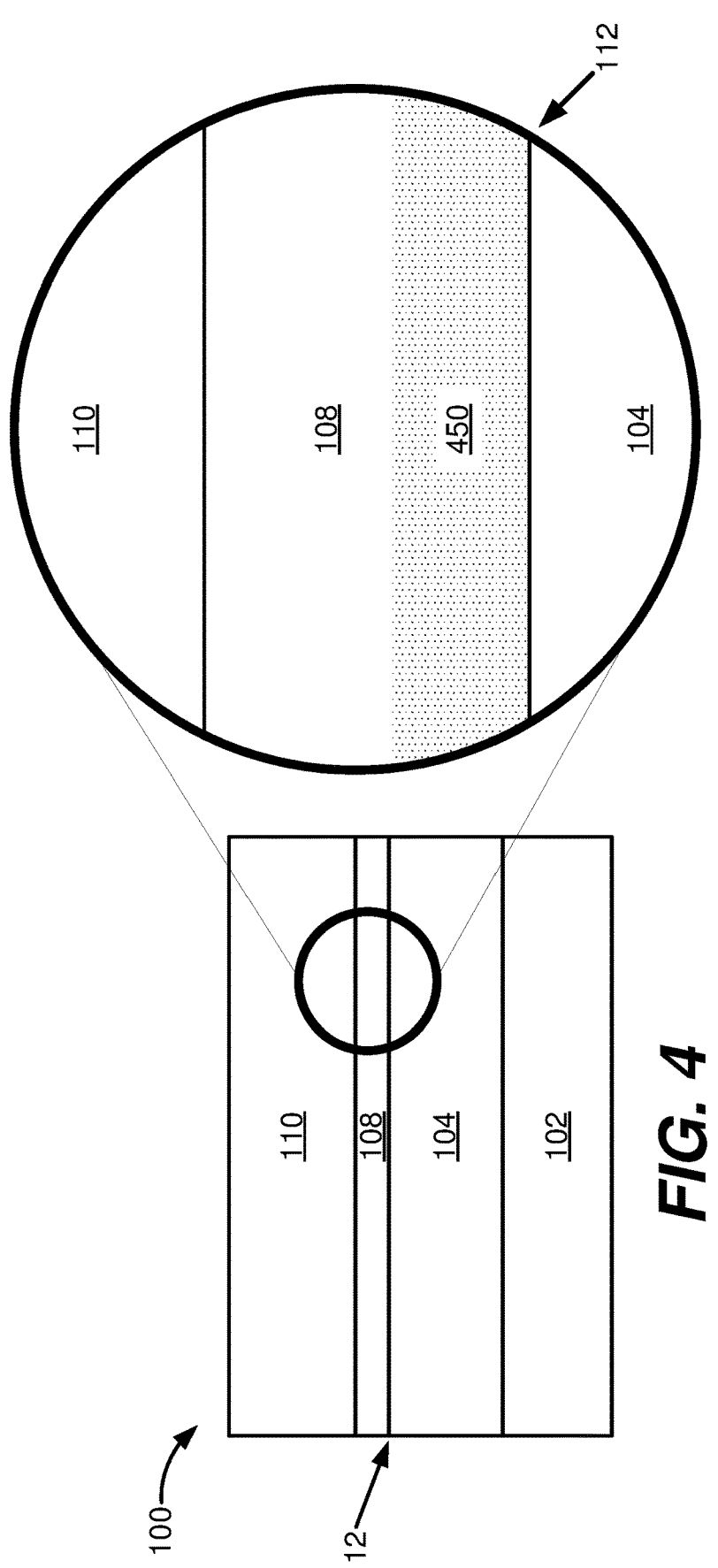
FIG. 4 is an example of a material stack with a gradient composition in the nucleation layer according to various embodiments.

FIG. 4 shows an example of a zoomed in schematic illustration of a stack 400 having substrate 102 (which may be the same as substrate 102 in FIG. 1A) where the dielectric-metal interface 112 between dielectric layer 104 and Mo nucleation layer 108 after deposition of metal layer 110. Dielectric-metal interface 112 is the same as dielectric-metal interface 112 in FIG. 1A; dielectric layer 104 may be the same as dielectric layer 104 in FIGS. 1A and 1B; Mo nucleation layer 108 may be the same as nucleation layer 108 in FIGS. 1A and 1B; metal layer 110 may be the same as metal layer 110 in FIGS. 1A and 1B. In this example, Mo nucleation layer 108 includes a gradient such that region 450 of the Mo nucleation layer 108 either has increased amounts of "impurities" or non-molybdenum component elements such as boron, tungsten, fluorine, oxygen, nitrogen, or chlorine, while the remainder of Mo nucleation layer 108 is converted to Mo metal when metal layer 110 is deposited. Without being bound by a particular theory, it is believed that having this region 450 prevents defects from forming in the dielectric layer 104 that can cause quantum tunneling or data loss in Mo-based gate structures.

APPARATUS

Any suitable chamber may be used to implement the disclosed embodiments. Example deposition apparatuses include various systems, e.g., ALTUS® and ALTUS® Max, available from Lam Research Corp., of Fremont, California, or any of a variety of other commercially available processing systems. The process can be performed on multiple deposition stations in parallel.

In some embodiments, a nucleation layer deposition process is performed at a first station that is one of two, five, or even more deposition stations positioned within a single deposition chamber. For example, nucleation layer deposition may be performed at a first station, followed by lower temperature hydrogen reduction of a metal precursor at a second station, followed by high temperature hydrogen reduction of a metal precursor at a third station. Each station may have independent temperature control. In some embodiments, various steps for the process are performed at two different stations of a deposition chamber. For example, the substrate may be exposed to $NH_3$ in a first station using an individual gas supply system that creates a localized atmosphere at the substrate surface, and then the substrate may be transferred to a second station to be exposed to a metal halide, metal oxyhalide, metal chloride, metal fluoride, or metal oxychloride precursor to deposit the nucleation layer. In some embodiments, the substrate may then be transferred back to the first station for a second exposure of $NH_3$. Then the substrate may be transferred to the second station for exposure to the metal precursor. The substrate may also be exposed to $NH_3$ at another station following the first metal chloride or metal oxychloride deposition. This may be repeated as necessary to complete nucleation layer deposition and proceed with bulk layer deposition in the same or different stations.

In another example, a nucleation layer deposition process is performed at a first station and a higher temperature treatment is performed at a second station such that $NH_3$ is plumbed to the second station for the treatment. The third station may be used to deposit bulk.

In some embodiments, multiple chambers are used to perform the methods described herein. For example, deposition of the nucleation layer may be performed in a first chamber and deposition of the bulk metal layer performed in a second chamber. The two chambers may be connected to a common vacuum chamber such that the substrate can be transferred between them without exposure. In alternate embodiments, the chambers are not connected under vacuum, with the substrate exposed to air during transfer. Any oxidation can be reduced in the subsequent processing as described above.

Figure 5:
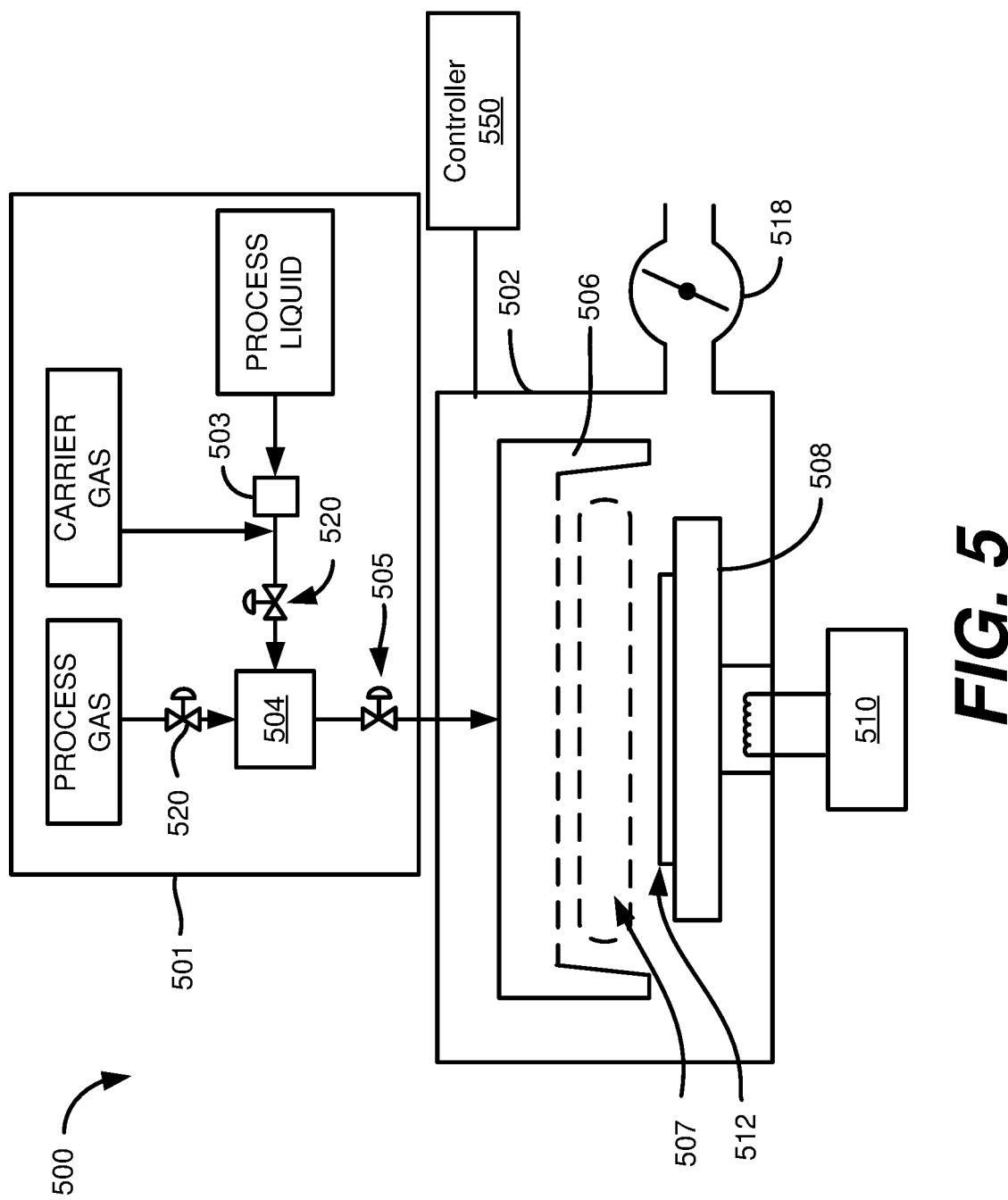
FIG. 5 is a schematic diagram of an example process chamber for performing disclosed embodiments.
Figure 6:
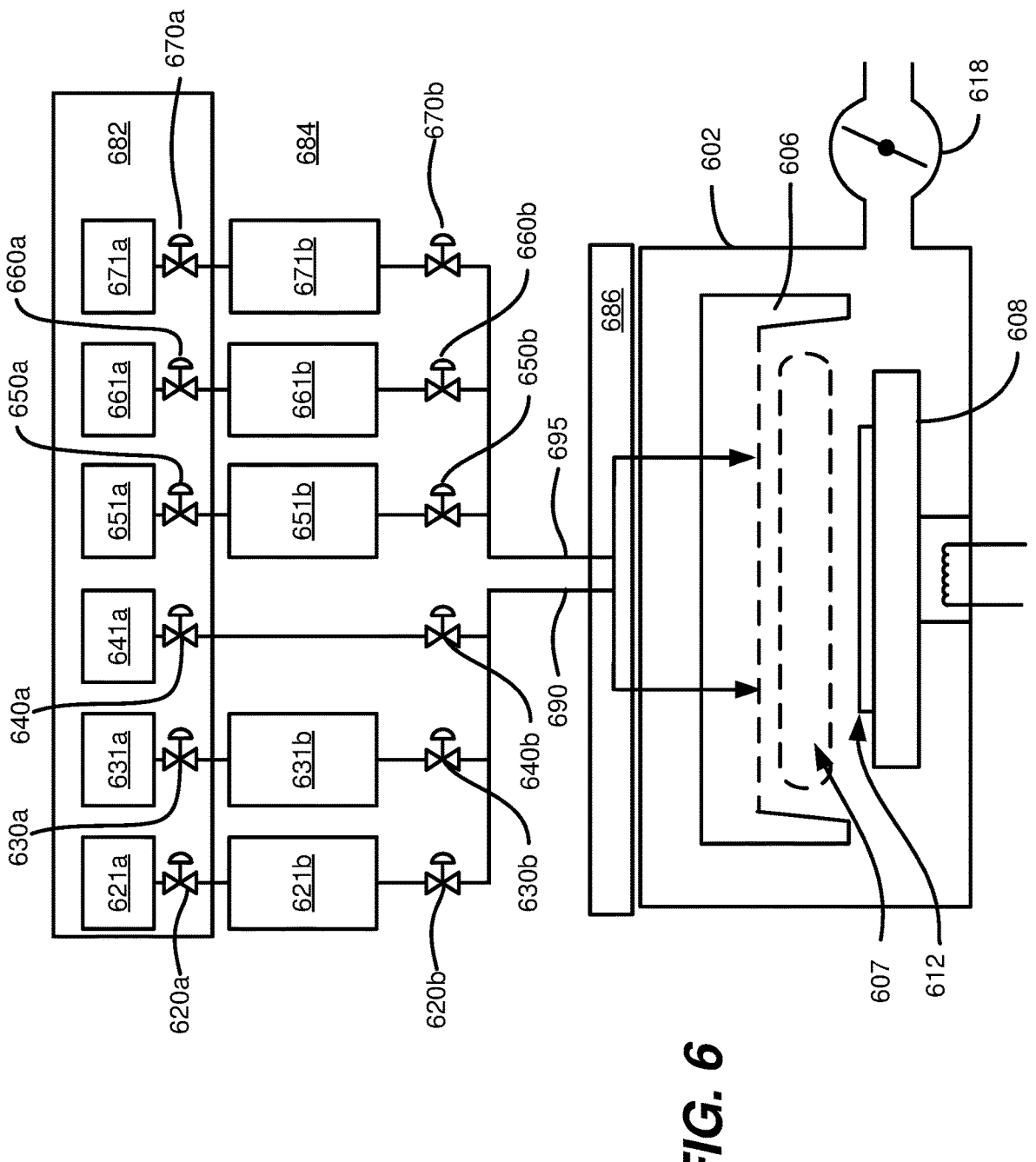
FIGS. 6 and 7A-7C are schematic illustrations of example gas flow diagrams for apparatuses that may be used to perform certain disclosed embodiments.

FIG. 5 depicts a schematic illustration of an embodiment of an atomic layer deposition (ALD) process station 500 having a process chamber body 502. A plurality of process stations 500 may be included in a tool environment. For example, FIG. 6 depicts an embodiment of a system. In some embodiments, one or more hardware parameters of process station 500 including those discussed in detail below may be adjusted programmatically by one or more computer controllers 550.

Process station 500 fluidly communicates with reactant delivery system 501 for delivering process gases to a distribution showerhead 506. Reactant delivery system 501 includes a mixing vessel 504 for blending and/or conditioning process gases, such as an oxygen-containing Mo precursor gas, or NH$_3$ and/or nitrogen gas, for delivery to distribution showerhead 506. One or more mixing vessel inlet valves 520 may control introduction of process gases to mixing vessel 504. Gases are delivered to process chamber body 502 and may react in processing region 507.

As an example, the embodiment of FIG. 5 includes a vaporization point 503 for vaporizing liquid reactant to be supplied to the mixing vessel 504 with valve 505 directing reactants from the mixing vessel 504 to the process chamber body 502. In some embodiments, vaporization point 503 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 503 may be heat traced. In some examples, mixing vessel 504 may also be heat traced. In one non-limiting example, piping downstream of vaporization point 503 has an increasing temperature profile extending from approximately 100° C. to approximately 150° C. at mixing vessel 504.

In some embodiments, liquid precursor or liquid reactant may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 503. In one scenario, a liquid injector may be mounted directly to mixing vessel 504. In another scenario, a liquid injector may be mounted directly to distribution showerhead 506.

In some embodiments, a liquid flow controller (LFC) upstream of vaporization point 503 may be provided for controlling a mass flow of liquid for vaporization and delivery to process station 500. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Distribution showerhead 506 distributes process gases toward substrate 512. In the embodiment shown in FIG. 5, the substrate 512 is located beneath distribution showerhead 506 and is shown resting on a pedestal 508. Distribution showerhead 506 may have any suitable shape, and may have any suitable number and arrangement of ports for distributing process gases to substrate 512.

In some embodiments, pedestal 508 may be raised or lowered to expose substrate 512 to a volume between the substrate 512 and the distribution showerhead 506. It will be appreciated that, in some embodiments, pedestal height may be adjusted programmatically by a suitable computer controller 550.

In some embodiments, pedestal 508 may be temperature controlled via heater 510. In some embodiments, the pedestal 508 may be heated to a temperature of between 50° C. and 700° C., depending on the chamber and its function in the overall deposition process. For example, some chambers may have a pedestal 508 set to a temperature of between 250° C. and about 400° C., such as for deposition of a nucleation layer or initial ALD cycles of a main conductor layer; some chambers may have a pedestal 508 set to a temperature between about 350° C. and about 700° C. or greater than about 400° C. for some deposition of main conductor layers particularly those that are deposited using oxygen-containing Mo precursors such as MoO$_2$Cl$_2$.

Further, in some embodiments, pressure control for process station 500 may be provided by butterfly valve 518. As shown in the embodiment of FIG. 5, butterfly valve 518 throttles a vacuum provided by a downstream vacuum pump (not shown). However, in some embodiments, pressure control of process station 500 may also be adjusted by varying a flow rate of one or more gases introduced to the process station 500.

In some embodiments, a position of distribution showerhead 506 may be adjusted relative to pedestal 508 to vary a volume between the substrate 512 and the distribution showerhead 506. Further, it will be appreciated that a vertical position of pedestal 508 and/or distribution showerhead 506 may be varied by any suitable mechanism within the scope of the present disclosure. In some embodiments, pedestal 508 may include a rotational axis for rotating an orientation of substrate 512. It will be appreciated that, in some embodiments, one or more of these example adjustments may be performed programmatically by one or more suitable computer controllers 550.

In some embodiments, instructions for a controller 550 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or an NH$_3$ and/or nitrogen reactant gas, instructions for setting a flow rate of a carrier gas (such as argon), instructions for igniting a plasma, and time delay instructions for the first recipe phase. A second recipe phase may include instructions for setting a flow rate of an inert and/or metal halide or metal oxyhalide precursor gas, instructions for setting a flow rate of a carrier gas (such as argon), and time delay instructions for a second recipe phase. A third, subsequent recipe phase may include instructions for modulating or stopping a flow rate of an inert and/or a reactant gas, and instructions for modulating a flow rate of a carrier or purge gas and time delay instructions for the third recipe phase. A fourth recipe phase may include instructions for modulating a flow rate of reducing agent gas, instructions for modulating the flow rate of a carrier or purge gas, and time delay instructions for the fourth recipe phase. A fifth, subsequent recipe phase may include instructions for modulating or stopping a flow rate of an inert and/or a second metal halide or metal oxyhalide reactant gas, and instructions for modulating a flow rate of a carrier or purge gas and time delay instructions for the fifth recipe phase. It will be appreciated that these recipe phases may be further subdivided and/or iterated in any suitable way within the scope of the disclosed embodiments. In some embodiments, the controller 550 may include any of the features described below with respect to system controller 829 of FIG. 8.

FIG. 6 shows a schematic illustration of a line diagram of gas source and line configuration for a single station of an apparatus suitable for performing certain disclosed embodiments. While only one station is depicted, it will be understood that an apparatus may include one or more of these identical, similar, or different modules for processing substrates. A single station chamber may be used with a single station to process only one substrate per chamber at a time. In some embodiments, a single station is a station within a multi-station chamber having two or more stations, such as four stations. While a single station is shown, in some embodiments, multiple stations may be used where gas sources are configured to inlet certain gases to some stations but not other stations.

In the station depicted in FIG. 6, process chamber 602 includes a showerhead 606, and a movable pedestal 608 for holding a substrate 612. Pressure control for the process chamber 602 may be provided by butterfly valve 618 to keep the process under vacuum. The microvolume 607 generated between showerhead 606 and movable pedestal 608 may be modulated by moving the movable pedestal 608 vertically to narrow and widen the space between the showerhead 606 and the movable pedestal 608, thereby changing the partial pressure of various gases in the microvolume 607.

Showerhead 606 may be a dual plenum showerhead as depicted by the two arrows, which shows that gas flows may enter the showerhead using different lines, and may also exit the showerhead using different lines, which may be performed to reduce the likelihood of gases interacting with each other in the lines. That is, in some embodiments, gases selected to be introduced in the same line may be selected such that they do not interact with each other and thus cannot result in formation of excess byproducts or deposited materials within the lines, which may contribute to the formation of defects on the substrate 612. In some embodiments, showerhead 606 may be heated. In some embodiments, showerhead 606 is both heated and is a dual-plenum showerhead.

Upstream of showerhead 606 is a manifold 686 which may be used to collect gases prior to delivery to the showerhead. In some embodiments, the manifold is configured such that gases from different lines do not interact with each other but can be separately delivered to the showerhead 606 and can also be controlled with upstream and downstream valves (not shown). Showerhead 606 may be a single plenum or multi-plenum showerhead. A multi-plenum showerhead may be a dual plenum showerhead or triple plenum showerhead. A dual plenum showerhead may allow flow of W and/or fluorine-containing gases, Mo-containing precursor, and hydrogen in one plenum while a second plenum is used to flow boron-containing gases, hydrogen, $NH_3$, and argon. Such embodiment may be used to avoid upstream reactions between a Mo or W-containing precursor with $NH_3$ and a boron-containing gas. Manifold 686 may be configured so that it is close in distance to the showerhead 606 to allow for high pressured volumes of gases to accumulate before a valve is released to deliver high pressure gas to the microvolume 607.

The configuration shown in FIG. 6 includes multiple gas sources, which for purposes of this example, will be referred to as being associated with a particular gas. However it will be understood that the gas sources may include any suitable gas used as a precursor or reactant for performing certain disclosed embodiments, and the configuration may be selected such that that deliver gases to one line are less likely to interact with each other or cause deposition of films than if mixed with gas sources delivered to the other line, and vice versa. It will also be understood that while three gas sources are shown as being delivered to a single line, and only two separate lines are depicted, one or more gas sources may be delivered to a single line, and two or more separate lines may all be delivered to the manifold 686 before being introduce to the showerhead 606.

Argon gas source 621a, $WF_6$ gas source 631a, and Mo-containing precursor gas source 641a are included in gas box 682 separate from top plate 684. Argon gas source 621a, $WF_6$ gas source 631a, and Mo-containing precursor gas source 641a are each delivered via its corresponding line to a line 690 to be delivered to the manifold 686.

Diborane ($B_2H_6$) gas source 651a, $NH_3$ gas source 661a, and argon gas source 671a are also provided in gas box 682. $B_2H_6$ gas source 651a, $NH_3$ gas source 661a, and argon gas source 671a are each delivered via its corresponding line to a line 695 to be delivered to the manifold 686.

Flow of argon from argon gas source 621a is controlled by argon control valve 620a prior to delivery to an argon charge volume 621b such that argon can accumulate in argon charge volume 621b prior to delivery to the showerhead 606; that is, although the gas box 682 may be physically farther away from the process chamber 602, having the argon charge volume 621b in closer vicinity to the showerhead 606 and having argon outlet valve 620b to control the flow of argon from the argon charge volume 621b allows for better control and increased pressure of argon that can be delivered to the showerhead 606, and therefore delivered to the substrate 612.

Similarly, flow of $WF_6$ from $WF_6$ gas source 631a is controlled by $WF_6$ control valve 630a prior to delivery to $WF_6$ charge volume 631b such that tungsten can accumulate in $WF_6$ charge volume 631b prior to delivery to the showerhead 606; that is, although the gas box 682 may be physically farther away from the process chamber 602, having the $WF_6$ charge volume 631b in closer vicinity to the showerhead 606 and having $WF_6$ outlet valve 630b to control the flow of $WF_6$ from the $WF_6$ charge volume 631b allows for better control and increased pressure of $WF_6$ that can be delivered to the showerhead 606, and therefore delivered to the substrate 612.

Flow of Mo-containing precursor from Mo-containing precursor gas source 641a is controlled by Mo-containing precursor control valve 640*a* prior to delivery. In some embodiments, Mo-containing precursor can pass through a plasma generated prior to delivery to the process chamber 602. In some embodiments, Mo-containing precursor is delivered from a remote source. Molybdenum-containing precursor outlet valve 640*b* may be used to control flow after Mo-containing precursor flows through the line towards the showerhead to modulate the flow and increase pressure of the Mo-containing precursor introduced to the showerhead 606.

Flow of argon gas, $WF_6$, and Mo-containing precursor accumulates via line 690 to manifold 686, where it is delivered to showerhead 606 separate from gases that are delivered via line 695 to prevent interactions between, for example, $WF_6$ and $B_2H_6$, which can form tungsten in the lines.

Flow of $B_2H_6$ from $B_2H_6$ gas source 651*a* is controlled by $B_2H_6$ control valve 650*a* prior to delivery of $B_2H_6$ to $B_2H_6$ charge volume 651*b* such that $B_2H_6$ can accumulate in $B_2H_6$ charge volume 651*b* prior to delivery to showerhead 606. Although gas box 682 may be physically farther away from the process chamber 602 than manifold 686, having $B_2H_6$ charge volume 651*b* in closer vicinity to showerhead 606 and having $B_2H_6$ outlet valve 650*b* to control the flow of $B_2H_6$ from the $B_2H_6$ charge volume 651*b* allows for better control and increased pressure of $B_2H_6$ that can be delivered to the showerhead 606 via manifold 686.

Flow of $NH_3$ from $NH_3$ gas source 661*a* is controlled by $NH_3$ control valve 660*a* prior to delivery of $NH_3$ to $NH_3$ charge volume 661*b*, such that $NH_3$ can accumulate in $NH_3$ charge volume 661*b* prior to delivery to showerhead 606. Although gas box 682 may be physically farther away from the process chamber 602 than manifold 686, having $NH_3$ charge volume 661*b* in closer vicinity to showerhead 606 and having $NH_3$ outlet valve 660*b* to control the flow of $NH_3$ from the $NH_3$ charge volume 661*b* allows for better control and increased pressure of $NH_3$ that can be delivered to the showerhead 606 via manifold 686.

Flow of argon from argon gas source 671*a* is controlled by argon control valve 670*a* prior to delivery to an argon charge volume 671*b* such that argon can accumulate in argon charge volume 671*b* prior to delivery to the showerhead 606; that is, although the gas box 682 may be physically farther away from the process chamber 602, having the argon charge volume 671*b* in closer vicinity to the showerhead 606 and having argon outlet valve 670*b* to control the flow of argon from the argon charge volume 671*b* allows for better control and increased pressure of argon that can be delivered to the showerhead 606, and therefore delivered to the substrate 612.

Once gas accumulates and is pressurized in charge volumes and can be controlled via outlet valves, the flow of gases to the manifold 686 can increase, thereby increasing the volume and the pressure of gases introduced to microvolume 607. Such embodiments may be particular suitable for processing substrates for forming 3D NAND structures.

Apparatuses disclosed herein may be set a subatmospheric pressures, such as less than about 760 Torr, or less than about 600 Torr, to keep the substrate under vacuum. Some partial pressures of gases may be delivered up to about 1500 Torr to the substrate for a 300 mm wafer.

The movable pedestal combined with the charge volume, line, and manifold configuration can collectively cause introduction of gases to the microvolume having a partial pressure less than about 1 Torr to greater than about 90 Torr. For example, the partial pressure may be less than 1 Torr for a 3 Torr chamber with diluted flow, or the partial pressure may be greater than 90 Torr for a 90 Torr chamber with pure flow (without carrier gas).

Figures 7A, 7B:
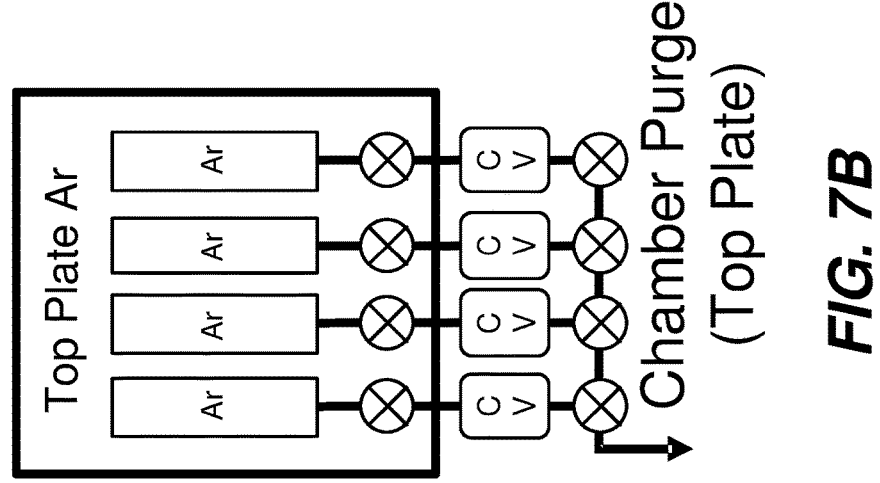

FIG. 7A shows a schematic illustration of a line diagram of gas source and line configuration for a single station of an apparatus suitable for performing certain disclosed embodiments. "CV" used in drawings herein refer to charge volumes. While only one station is depicted, it will be understood that an apparatus may include one or more of these identical, similar, or different modules for processing substrates. A single station chamber may be used with a single station to process only one substrate per chamber at a time. In some embodiments, a single station is a station within a multi-station chamber having two or more stations, such as four stations. While a single station is shown, in some embodiments, multiple stations may be used where gas sources are configured to inlet certain gases to some stations but not other stations.

In the station depicted in FIG. 7A, process chamber 702 includes a showerhead 706, and a movable pedestal 708 for holding a substrate 712. Pressure control for the process chamber 702 may be provided by butterfly valve 718 to keep the process under vacuum. The microvolume 707 generated between showerhead 706 and movable pedestal 708 may be modulated by moving the movable pedestal 708 vertically to narrow and widen the space between the showerhead 706 and the movable pedestal 708, thereby changing the partial pressure of various gases in the microvolume 707.

Showerhead 706 may be a dual plenum showerhead as depicted by the two arrows, which shows that gas flows may enter the showerhead using different lines, and may also exit the showerhead using different lines, which may be performed to reduce the likelihood of gases interacting with each other in the lines. That is, in some embodiments, gases selected to be introduced in the same line may be selected such that they do not interact with each other and thus cannot result in formation of excess byproducts or deposited materials within the lines, which may contribute to the formation of defects on the substrate 712. In some embodiments, showerhead 706 may be heated. In some embodiments, showerhead 706 is both heated and is a dual-plenum showerhead.

Upstream of showerhead 706 is a manifold 786 which may be used to collect gases prior to delivery to the showerhead. In some embodiments, the manifold is configured such that gases from different lines do not interact with each other but can be separately delivered to the showerhead 706 and can also be controlled with upstream and downstream valves (not shown). Showerhead 706 may be a single plenum or multi-plenum showerhead. A multi-plenum showerhead may be a dual plenum showerhead or triple plenum showerhead. A dual plenum showerhead may allow flow of W- and/or fluorine-containing gases, Mo-containing precursor, and hydrogen in one plenum while a second plenum is used to flow boron-containing gases, hydrogen, $NH_3$, and argon. Such embodiment may be used to avoid upstream reactions between a Mo or W-containing precursor with $NH_3$ and a boron-containing gas. Manifold 786 may be configured so that it is close in distance to the showerhead 706 to allow for high pressured volumes of gases to accumulate before a valve is released to deliver high pressure gas to the microvolume 707.

The configuration shown in FIG. 7 includes multiple gas sources, which for purposes of this example, will be referred to as being associated with a particular gas. However it will be understood that the gas sources may include any suitable gas used as a precursor or reactant for performing certain disclosed embodiments, and the configuration may be selected such that that deliver gases to one line are less likely to interact with each other or cause deposition of films than if mixed with gas sources delivered to the other line, and vice versa. It will also be understood that while three gas sources are shown as being delivered to a single line, and only two separate lines are depicted, one or more gas sources may be delivered to a single line, and two or more separate lines may all be delivered to the manifold 786 before being introduce to the showerhead 706.

Argon gas sources and optionally hydrogen gas sources are included in gas box 782a. Argon gas sources and optionally hydrogen gas sources deliver argon gas and optionally hydrogen as respectively via its corresponding line to be delivered to the manifold 786.

Molybdenum precursor gas source is included in gas box 782b. A Mo-containing precursor gas is delivered via its corresponding line to the manifold 786.

Ammonia and argon gas sources are included in gas box 782c separate from gas boxes 782a and 782b. Ammonia and argon are flowed from these gas sources via its corresponding line to be delivered to manifold 786.

In some embodiments, a chamber purge top plate may be used as shown in FIG. 7B whereby argon gas sources are used.

Flow of argon gas or optionally hydrogen, Mo-containing precursor, and $NH_3$ are separated to reduce interactions between, for example, Mo-containing precursor and hydrogen, which can form Mo in the lines.

Once gas accumulates and is pressurized in charge volumes and can be controlled via outlet valves, the flow of gases to the manifold 786 can increase, thereby increasing the volume and the pressure of gases introduced to microvolume 707. Such embodiments may be particular suitable for processing substrates for forming 3D NAND structures.

Apparatuses disclosed herein may be set a subatmospheric pressures, such as less than about 760 Torr, or less than about 600 Torr, to keep the substrate under vacuum. Some partial pressures of gases may be delivered up to about 1500 Torr to the substrate for a 300 mm wafer.

The movable pedestal combined with the charge volume, line, and manifold configuration can collectively cause introduction of gases to the microvolume having a partial pressure less than about 1 Torr to greater than about 90 Torr. For example, the partial pressure may be less than 1 Torr for a 3 Torr chamber with diluted flow, or the partial pressure may be greater than 90 Torr for a 90 Torr chamber with pure flow (without carrier gas).

Figure 7C:
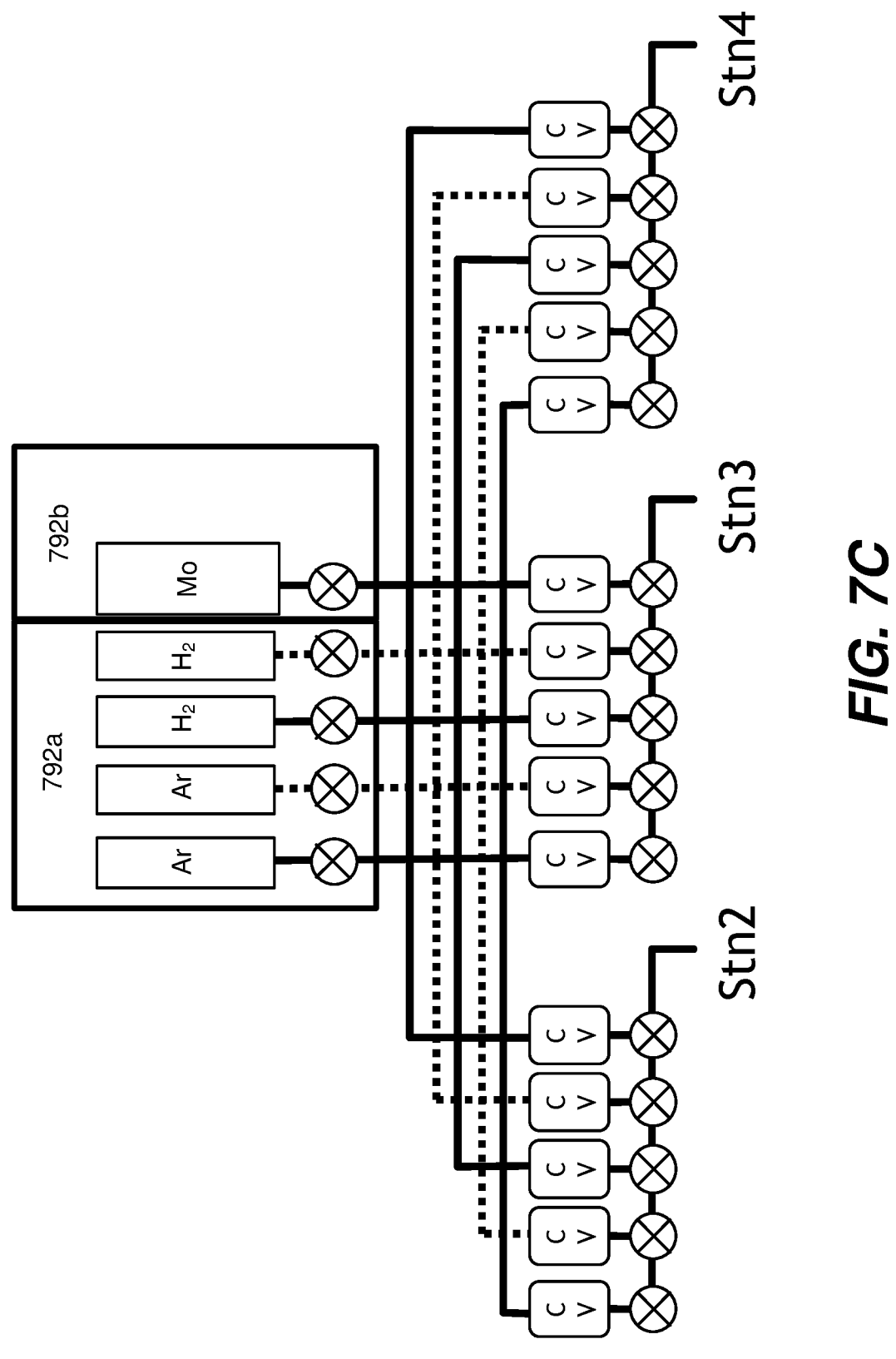

FIG. 7C shows an example schematic illustration of a line diagram of gas source and line configuration for a single station of an apparatus suitable for performing certain disclosed embodiments. "Stn2," "Stn3," and "Stn4," refer to stations that may be those such as process chamber body 502 of FIG. 5, process chamber 602 of FIG. 6, and process chamber 702 of FIG. 7A. Gas box 792a includes argon and hydrogen gas sources and gas box 792b includes Mo-containing gas source, which are each delivered to different charge volumes and manifolds of corresponding stations to allow performance of different operations in different stations, each set under different process conditions.

Hardware such as those described above can be used to implement treatment of memory device wordline dielectric surfaces to boron, fluorine, tungsten-containing species and other non-molybdenum component element sources prior to deposition of a nucleation layer such as $MoO_xN_y$ and/or main conductor layer of elemental Mo. These example chambers and systems can be used to deliver $B_2H_6$, hydrogen, and argon to semiconductor substrates in either an ALD or CVD mode. In some embodiments, gas charge volume(s) are used to deliver pulses of gas mixtures having $B_2H_6$, hydrogen, argon, nitrogen, and combinations thereof to semiconductor wafers in an ALD mode. This may cause a wafer surface to be exposed to $B_2H_6$, hydrogen, and nitrogen which can result in adsorbed boron hydride ($BH_x$) on the wafer surface. The adsorbed $BH_x$ can diffuse into the substrate directly or react further.

In various embodiments, hardware such as described above can be used to deliver $WF_6$-argon ($WF_6$—Ar) to a semiconductor substrate in ALD or CVD mode. In some embodiments, gas charge volume(s) are used to deliver pulses of $WF_6$—Ar gas mixtures to semiconductor wafers in ALD mode (W and F exposure). Tungsten hexafluoride exposure can cause tungsten fluoride ($WF_x$) to be adsorbed on the wafer surface. The adsorbed $WF_x$ can diffuse into the substrate directly or react further.

In various embodiments, hardware is configured to deliver one or more ALD pulses of ($B_2H_6$—$H_2$—Ar—$N_2$) gas mixtures alternatively with pulses of ($WF_6$—Ar). In some embodiments, this causes a $WF_6$ reaction with $H_2$, $B_2H_6$, or $BH_x$ which can result in formation of W metal, tungsten boride ($WB_x$), $WF_x$ sub-fluorides and adsorbed F, HF, and adsorbed hydrogen. After a $WF_6$ reaction with $B_2H_6/H_2$, W metal, $WB_x$, $WF_x$, F, and HF are available on the semiconductor surface and can diffuse into the substrate.

As noted above, while multi-station chambers are described herein, certain disclosed embodiments can be implemented in single-chamber apparatuses. For example, in a single-chamber apparatus, gas delivery hardware can be used to expose a semiconductor surface to pulses of WF6/Ar and B2H6/H2/NH3 through independent WF6-Ar gas charge volumes, B2H6/H2/N2/Ar gas charge volumes, and NH3/H2/Ar gas charge volumes feeding into a showerhead above a wafer. In various embodiments, a single plenum showerhead is used. In various embodiments, a dual plenum showerhead is used. For example, a dual plenum showerhead may include WF6/Ar+MoOxCly+H2 in one plenum and B2H6/H2/NH3/Ar in the other, which may be used to avoid upstream reaction of Mo or W precursor with NH3 and B2H6. In various embodiments, gas charge volumes can be used with continuous trickle purge sweeping control valve outlets.

In various embodiments, $WF_6$/Ar, $B_2H_6/H_2$/Ar/$N_2$, and $NH_3/H_2$/Ar gas delivery hardware can be used in a single-wafer or multi-station deposition chamber. In various embodiments, $WF_6$/Ar, $B_2H_6/H_2$/Ar/$N_2$, and $NH_3/H_2$/Ar gas delivery hardware can be used at a first deposition station in a multi-station deposition chamber.

Various disclosed embodiments may be implemented in multi-chamber apparatuses. For example, one or more chambers can be configured to cause W-F-B exposure on semiconductor substrates. One or more chambers may be configured to cause nucleation layer, $MoO_xN_y$, or $MoO_xN_y$ deposition on semiconductor substrates. One or more chambers may be configured to cause metallic Mo deposition on semiconductor substrates. One or more chambers may be configured to cause deposition of $MoO_xN_y$ and metallic Mo.

Figure 8:
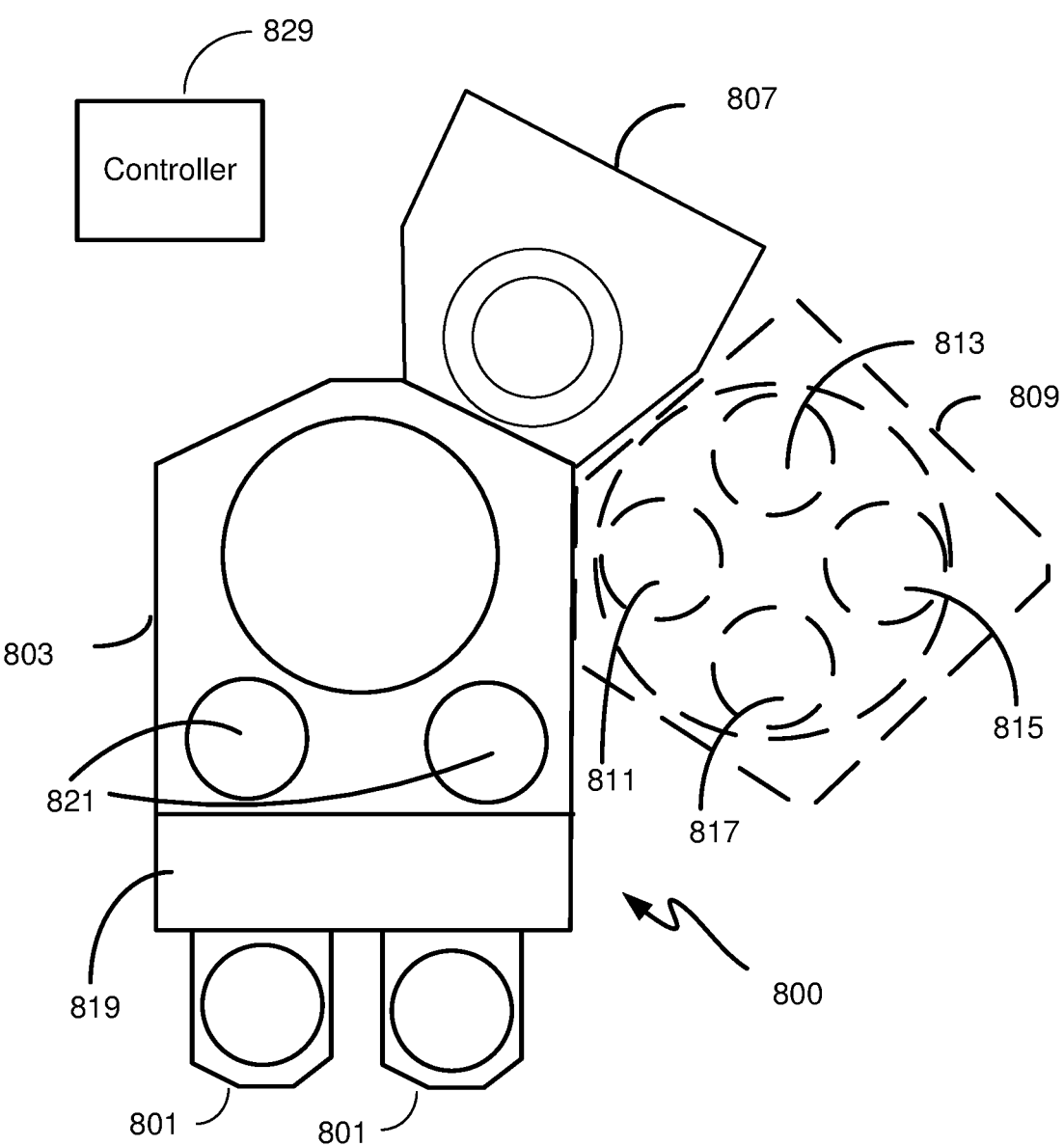
FIG. 8 is a block diagram of a processing system suitable for conducting deposition processes in accordance with embodiments described herein.

FIG. 8 is a block diagram of a processing system suitable for conducting deposition processes in accordance with embodiments described herein. The system 800 includes a transfer module 803. The transfer module 803 provides a clean, pressurized environment to minimize the risk of contamination of substrates being processed as they are moved between the various reactor modules. Mounted on the transfer module 803 is a multi-station reactor 809 capable of performing ALD depositions as described herein. Multi-station reactor 809 may include multiple stations 811, 813, 815, and 817 that may sequentially perform these operations. For example, multi-station reactor 809 could be configured such that stations 811 and 813 perform nucleation layer deposition, and stations 813 and 815 perform bulk layer deposition. Each deposition station may include a heated wafer pedestal and a showerhead, dispersion plate or other gas inlet.

Also mounted on the transfer module 803 may be one or more single or multi-station modules 807 capable of performing plasma or chemical (non-plasma) pre-cleans. The module may also be used for various other treatments, e.g., reducing agent soaking. The system 800 also includes one or more (in this case two) wafer source modules 801 where wafers are stored before and after processing. An atmospheric robot (not shown) in the atmospheric transfer chamber 819 first removes wafers from the source modules 801 to loadlocks 821. A wafer transfer device (generally a robot arm unit) in the transfer module 803 moves the wafers from loadlocks 821 to and among the modules mounted on the transfer module 803.

In some embodiments, a high temperature showerhead is employed.

This allows single, rather than dual, plenum showerheads to be used. By maintaining showerhead internal wetted surfaces at greater than 150° C. or 200° C., NH₃ and metal oxychloride or metal chloride precursors can be used in a single plenum showerhead without ammonium chloride (NH₄Cl) condensation. Alternately dual-plenum showerheads may be used in which NH₃ is delivered through one plenum and metal chloride or oxychloride precursors can be delivered through the other plenum.

As noted above, in some embodiments, depositing both metal (nitride) nucleation and pure metal in a single process chamber facilitates the conversion of the as-deposited metal+$O_x$+$NH_x$+$Cl_x$ nucleation film to pure metal by high-temperature reaction with H₂, metal (oxychloride), and their byproducts (HCl, $OCl_x$, Metal-$Cl_x$, . . . ). This may be done in a multi-station reactor with low-temperature at the first deposition station and low or higher temperatures at subsequent deposition stations as described above. In some embodiments, the individual deposition stations in a multi-station deposition reactor can be isolated from each other by shaping the showerheads and pedestals such that in a pedestal-up process position, the two assemblies create a small process volume above the wafer and a very narrow gap to isolate the process volume from the main chamber. The narrow gap at the edge of the process volume can be augmented with an inert gas purge barrier to make it difficult for gas to diffuse from the main chamber into the process volume. The narrow gap at the edge of the process volume can also incorporate a local pumping plenum to prevent process gas from entering the main chamber. This can eliminate the risk of deposition or particle generation in the main chamber. The narrow edge gap by itself can eliminate the risk of gas from the main chamber diffusing back into the wafer processing volume such there is no station to station cross talk.

As noted above, in certain embodiments, a system includes two different deposition chambers. For example, referring to FIG. 8, two deposition chambers may be mounted on transfer module 803. In such embodiments, each deposition chamber may be a single or multi-station chamber. Still further, two deposition chambers not under common vacuum may be employed.

In certain embodiments, a system controller 829 is employed to control process conditions during deposition. The controller will typically include one or more memory devices and one or more processors. The processor may include a central processing unit (CPU) or computer, analog and/or digital input/output connections, stepper motor controller boards, etc.

The controller may control all of the activities of the deposition apparatus. The system controller executes system control software including sets of instructions for controlling the timing, mixture of gases, chamber pressure, chamber temperature, wafer temperature, radio frequency (RF) power levels if used, wafer chuck or pedestal position, and other parameters of a particular process. Other computer programs stored on memory devices associated with the controller may be employed in some embodiments.

Typically, there will be a user interface associated with the controller. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general-purpose processor. System control software may be coded in any suitable computer readable programming language. Alternatively, the control logic may be hard coded in the controller. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place.

The computer program code for controlling the deposition and other processes in a process sequence can be written in any conventional computer readable programming language: for example, assembly language, C, C++, Pascal, Fortran or others. Compiled object code or script is executed by the processor to perform the tasks identified in the program.

The controller parameters relate to process conditions such as, for example, process gas composition and flow rates, temperature, pressure, cooling gas pressure, and chamber wall temperature. These parameters are provided to the user in the form of a recipe and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the deposition processes described herein. Examples of programs or sections of programs for this purpose include substrate positioning code, process gas control code, pressure control code, and heater control code.

In some implementations, a controller 829 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 829, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 829, in some implementations, may be a part of or coupled to a computer that is integrated with, coupled to the system, otherwise networked to the system, or a combination thereof. For example, the controller 829 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus, as described above, the controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a CVD chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The controller 829 may include various programs. A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in pedestal or chuck. Appropriately programmed feedback and control algorithms may be used with data from these sensors to maintain desired process conditions.

The foregoing describes implementation of embodiments of the disclosure in a single or multi-chamber semiconductor processing tool.

The foregoing describes implementation of disclosed embodiments in a single or multi-chamber semiconductor processing tool. The apparatus and process described herein may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility. Lithographic patterning of a film typically includes some or all of the following steps, each step provided with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

In the description above and in the claims, numerical ranges are inclusive of the end points of the range. For example, "a thickness between 1 and 5 nm" includes 1 nm and 5 nm. Similarly, ranges represented by a dash are inclusive of the end points of the ranges.

EXPERIMENTAL

Figure 9:
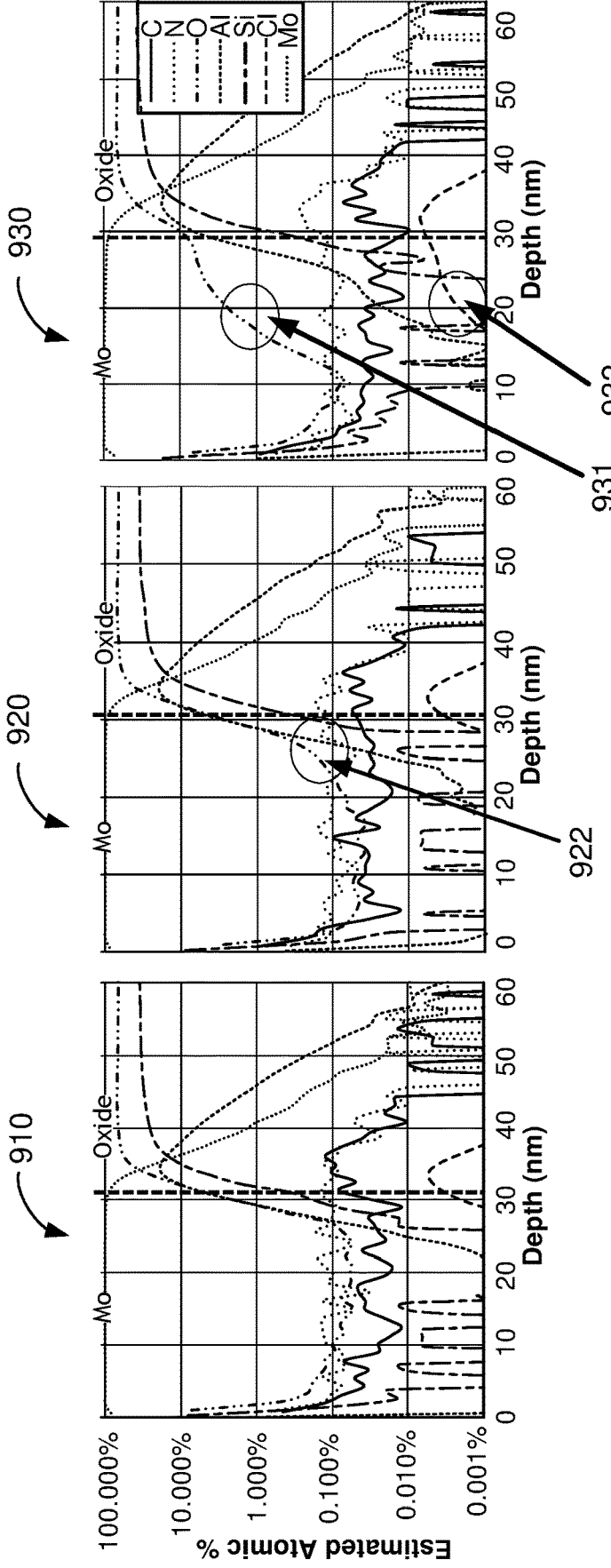
FIG. 9 are graphs of atomic content of various elements in stacks deposited in accordance with certain disclosed embodiments.

Atomic composition of three different substrates having different Mo and MoOxNy stacks were evaluated. FIG. 9 shows the results from the evaluation at the Mo-oxide interface between the MoOxNy and the dielectric layer. In each of 910, 920, and 930, a dotted vertical line depicts an approximation of the interface between MoOxNy nucleation layer on the left and dielectric oxide on the right.

In 910, a main conductor layer Mo was deposited on MoOxNy nucleation layer using an oxygen-containing Mo precursor and a reduced hydrogen dose. The results showed low oxygen content at the Mo-oxide interface.

In 920, a main conductor layer Mo was deposited on MoOxNy nucleation layer using an oxygen-containing Mo precursor and an even further reduced (13% less than 910) hydrogen dose. Arrow 922 shows the oxide content at the interface being greater than in 910.

In 930, a main conductor layer Mo was deposited on MoOxNy nucleation layer using an oxygen-containing Mo precursor and an even further reduced (26% less than 910) hydrogen dose. Arrow 931 shows even greater oxygen content in the main conductor layer Mo than in 910 or 920. Similarly, arrow 932 also shows greater (though still low amounts of) chlorine at the interface.

These results show that hydrogen dose (e.g., flow rate and/or exposure duration) can affect the composition of the film at the Mo oxide interface.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method for processing substrates, the method comprising:
    providing a substrate having an oxide material thereon;
    depositing at least a portion of an elemental molybdenum layer over the oxide material using a first atomic layer deposition (ALD) process by exposing the oxide material to alternating pulses of a first oxygen-containing molybdenum precursor and a first reducing agent using a first set of process conditions;

modulating the first set of process conditions to increase non-molybdenum content when depositing the portion of the elemental molybdenum layer; and
    prior to depositing the portion of the elemental molybdenum layer, performing one of the following operations:
    exposing the oxide material to a soak gas selected from the group consisting of boron-containing gases, tungsten-containing gases, fluorine-containing gases, oxygen-containing gases, chlorine-containing gases, and combinations thereof; or
    exposing the oxide material to alternating pulses of a boron-containing gas and a tungsten-containing gas; or
    depositing a first layer on the oxide material using a second oxygen-containing molybdenum precursor and a second reducing agent using a second ALD process on the oxide material under a second set of process conditions.

2. The method of claim 1, wherein the first set of process conditions comprise using a flow rate of at least about 1000 sccm of the first reducing agent during the first ALD process.

3. The method of claim 1, wherein the first set of process conditions comprise exposing the substrate to the first reducing agent for at least 1 second during a cycle of the first ALD process.

4. The method of claim 1, wherein at least the second reducing agent is a nitrogen-containing gas, hydrogen, or combinations thereof; or at least one of the first and the second oxygen-containing molybdenum precursor is a molybdenum oxyhalide; or the second set of process conditions comprises increasing flow of a nitrogen-containing gas during the second ALD process; or less than half of the first layer is converted to a converted elemental molybdenum layer during or prior to the first ALD process.

5. The method of claim 1, further comprising one of the following operations: flowing nitrogen during depositing of the first layer; soaking the substrate having the oxide material thereon with a soak gas prior to depositing the first layer; or soaking the substrate having the oxide material thereon with a soak gas after depositing the first layer.

6. The method of claim 1, wherein the first layer is a crystalline layer or an amorphous layer.

7. The method of claim 1, wherein the first layer is a template for metal grain growth in the elemental molybdenum layer.

8. An apparatus for processing substrates, the apparatus comprising:
    first and second process chambers each configured to house a substrate, the first and second process chambers optionally being chambers within a multi-chamber apparatus;
    a substrate support in each of the first and the second process chambers;
    gas inlets configured to direct gas into each of the first and the second process chambers via one or more single or dual plenum showerheads;
    a heater configured to heat the substrate support in each process chamber; and
    a controller comprising program instructions for:
        (a) causing sequentially inletting of an oxygen-containing molybdenum precursor and a nitrogen-containing gas into the first process chamber while a substrate is housed in the first process chamber;
        (b) after (a), causing transfer of the substrate to the second process chamber;
        (c) after (b), causing sequentially inletting of an oxygen-containing molybdenum precursor and hydrogen into the second process chamber while the substrate is housed in the second process chamber; and (d) causing implementation of one or more of the program instructions selected from the group consisting of:

causing nitrogen to be inletted into the first process chamber when the substrate is housed in the first process chamber, causing temperature of the substrate support in the second process chamber to be at two different temperatures while the substrate is housed in the second process chamber, causing delivery of a soak gas to the first process chamber before or after sequentially inletting the oxygen-containing molybdenum precursor and the nitrogen-containing gas into the first process chamber, and causing reduced flow of hydrogen into the second process chamber while the substrate is housed in the second process chamber.

\* \* \* \* \*